(12) United States Patent
Miura

(10) Patent No.: US 12,185,468 B2
(45) Date of Patent: Dec. 31, 2024

(54) WIRING BOARD AND LIGHT-EMITTING DEVICE

(71) Applicant: NICHIA CORPORATION, Anan (JP)

(72) Inventor: Soichiro Miura, Tokushima (JP)

(73) Assignee: NICHIA CORPORATION, Anan (JP)

(*) Notice: Subject to any disclaimer, the term of this patent is extended or adjusted under 35 U.S.C. 154(b) by 196 days.

(21) Appl. No.: 18/069,805

(22) Filed: Dec. 21, 2022

(65) Prior Publication Data

US 2023/0209715 A1 Jun. 29, 2023

(30) Foreign Application Priority Data

Dec. 24, 2021 (JP) .................................. 2021-211505
Dec. 19, 2022 (JP) .................................. 2022-202446

(51) Int. Cl.
| H05K 1/18 | (2006.01) |
| H01S 3/23 | (2006.01) |
| H05K 1/02 | (2006.01) |
| H05K 1/11 | (2006.01) |

(52) U.S. Cl.
CPC ............ *H05K 1/181* (2013.01); *H01S 3/2383* (2013.01); *H05K 1/0274* (2013.01); *H05K 1/113* (2013.01); *H05K 2201/09409* (2013.01); *H05K 2201/09609* (2013.01); *H05K 2201/10121* (2013.01); *H05K 2201/10522* (2013.01)

(58) Field of Classification Search
CPC ...... H05K 1/181; H05K 1/0274; H05K 1/113; H05K 2201/09409; H05K 2201/09609; H05K 2201/10121; H05K 2201/10522; H01S 3/2383

USPC .......................................................... 361/767
See application file for complete search history.

(56) References Cited

U.S. PATENT DOCUMENTS

| 8,729,680 B2* | 5/2014 | Kobayashi ........ H01L 23/49827 |
| | | 257/664 |
| 2002/0001192 A1 | 1/2002 | Suehiro et al. |
| 2014/0182887 A1* | 7/2014 | Yoshioka ............ H01L 25/0655 |
| | | 174/250 |

FOREIGN PATENT DOCUMENTS

| JP | H01-286379 A | 11/1989 |
| JP | 2001-345485 A | 12/2001 |
| JP | 2004-151393 A | 5/2004 |
| JP | 2009-277705 A | 11/2009 |
| JP | 2012-099534 A | 5/2012 |
| WO | WO-2013/002348 A1 | 1/2013 |

* cited by examiner

*Primary Examiner* — Binh B Tran
(74) *Attorney, Agent, or Firm* — Foley & Lardner LLP

(57) ABSTRACT

A wiring board includes: an insulating member having a first upper surface, and a second upper surface located higher than the first upper surface; and a first wiring layer located on the first upper surface. The first upper surface has a wiring region that does not overlap with the second upper surface in a top view, and that is located in an exposed region. The first wiring layer extends from the wiring region to a connecting region that is connected to the wiring region, that overlaps with the second upper surface in a top view, and that is not exposed. The first wiring layer comprises a first pad portion located in the wiring region, and a first pattern portion located in the connecting region.

18 Claims, 13 Drawing Sheets

WIRING BOARD AND LIGHT-EMITTING DEVICE

CROSS-REFERENCE TO RELATED APPLICATION

The present application claims priority to Japanese Application No. 2021-211505, filed Dec. 24, 2021, and Japanese Application No. 2022-202446, filed Dec. 19, 2022, the contents of which are incorporated herein by reference in their entirety.

BACKGROUND

The present disclosure relates to a wiring board and a light-emitting device.

Japanese Patent Publication No. 2004-151393 describes a laser light source device in which a package houses a semiconductor laser and an optical component module disposed on a base substrate. The optical component module includes a lens and a group of elements for an isolator, and the base substrate has a recess in which the lens is mounted and a recess in which the group of elements for an isolator is mounted on the light exit side of the semiconductor laser.

SUMMARY

An object of the present disclosure is to provide a wiring board that allows for miniaturization of an electronic device, such as a light-emitting device. Another object is to provide a light-emitting device including the wiring board.

A wiring board according to an embodiment of the present disclosure has a first upper surface provided with a first wiring layer and a second upper surface located higher than the first upper surface. The first upper surface has a wiring region not overlapping with the second upper surface in a top view and being located in an exposed region. The first wiring layer extends from the wiring region to a connecting region. The connecting region is connected to the wiring region, overlaps with the second upper surface in a top view, and is not exposed. The first wiring layer includes a first pad portion located in the wiring region and a first pattern portion located in the connecting region. The first pattern portion has a length greater than a length of the first pad portion in a first direction perpendicular to a direction of extension of the first wiring layer.

A light-emitting device according to an embodiment of the present disclosure includes a wiring board having a first mounting surface provided with a wiring layer, an upper surface located higher than the first mounting surface, and a second mounting surface located lower than the first mounting surface, one or more light-emitting elements disposed on the first mounting surface, and one or a plurality of optical members disposed on the second mounting surface. The upper surface includes a region between the first mounting surface and the second mounting surface in a top view. The first mounting surface includes a wiring region. The wiring layer extends in the wiring region and a connecting region located under the upper surface in a top view. The wiring layer includes a first pad portion located in the wiring region and a first pattern portion located in the connecting region. The first pattern portion has a length greater than a length of the first pad portion in a first direction perpendicular to a direction of extension of the wiring layer.

With an embodiment of the present disclosure, a wiring board that can miniaturize a light-emitting device can be provided. A light-emitting device including the wiring board can also be provided.

DETAILED DESCRIPTION

Figure 1:
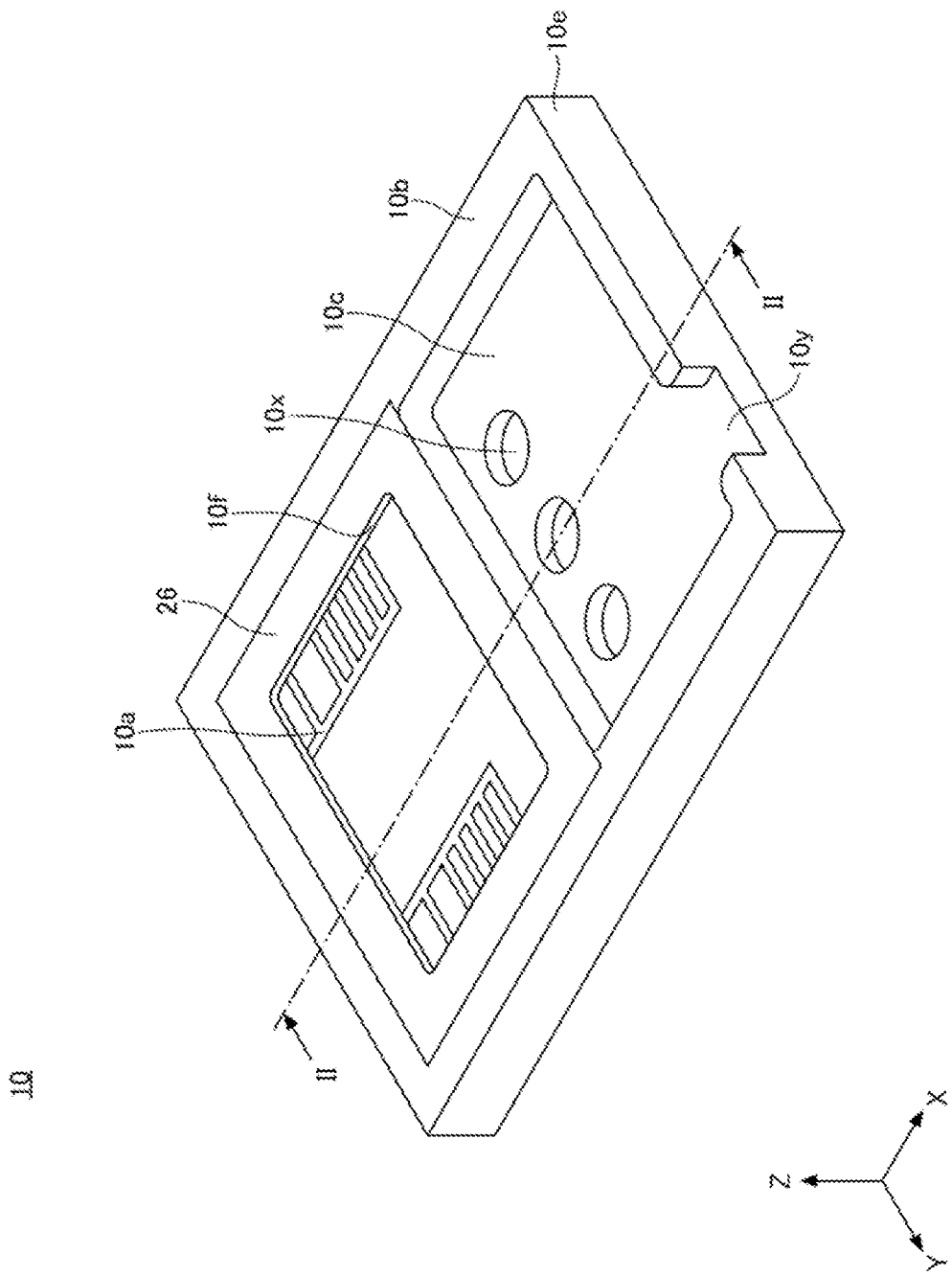
FIG. 1 is a schematic perspective view of an illustrative wiring board according to a first embodiment.

Certain embodiments of the invention will be described below referring to the accompanying drawings. The descriptions below include terms indicating specific directions or positions (such as "up," "down," and other terms containing these terms) as appropriate. However, these terms are used to facilitate understanding of the present invention referring to the drawings, and actual directions can be different. A portion or member with the same reference numeral in a plurality of drawings represents the same or equivalent portion or member.

In the present disclosure, as for polygonal shapes such as triangular shapes and quadrangular shapes, polygonal shapes with rounded corners, beveled corners, angled corners, reverse-rounded corners are also referred to as polygonal shapes. Likewise, not only shapes with such modification at corners (end of sides) but also shapes with modifications at intermediate portions of sides of the shapes are also referred to as polygons. That is, shapes based on polygonal shapes and partially modified are also interpreted as "polygonal shapes" in the present disclosure.

Such interpretation is not only polygonal shapes but also applies to terms denoting specific shapes such as trapezoids, circles, protrusions, and recesses. The same applies to sides forming such shapes. That is, even if an end or an intermediate portion of a side is modified, the modified portion is interpreted as a portion of a "side." When "polygonal shapes" and "sides" without such modified portions are intended to be distinguished from those with modifications, the term "exact" is added, such as an "exact quadrangular shape."

In the embodiments described below, examples of light-emitting devices and the like are described to give concrete form to the technical ideas of the present invention. However, the present invention is not limited to the description below. Unless otherwise specified, dimensions, materials, shapes, and relative positions of constituent components described below are not intended to limit the scope of the present invention thereto but rather are described as examples. Descriptions in one embodiment are applicable to other embodiments and modifications. Sizes or positional relationships of members illustrated in the drawings may be exaggerated in order to clarify the descriptions. To prevent the drawings from being too complicated, a schematic diagram in which the illustration of the components is partly omitted may be used, and cross-sectional end views showing only cut surfaces of members may be used for cross-sectional views.

First Embodiment

Figure 2:
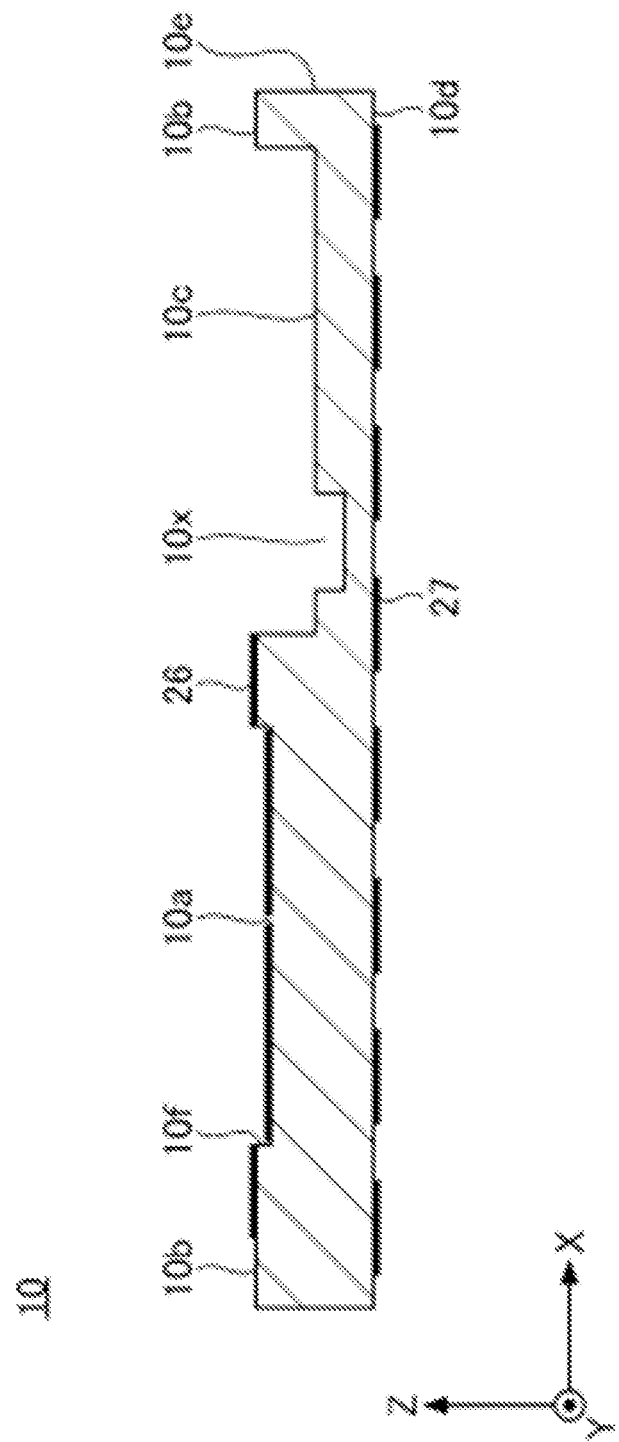
FIG. 2 is a schematic cross-sectional view taken along the line II-II of FIG. 1.
Figure 3:
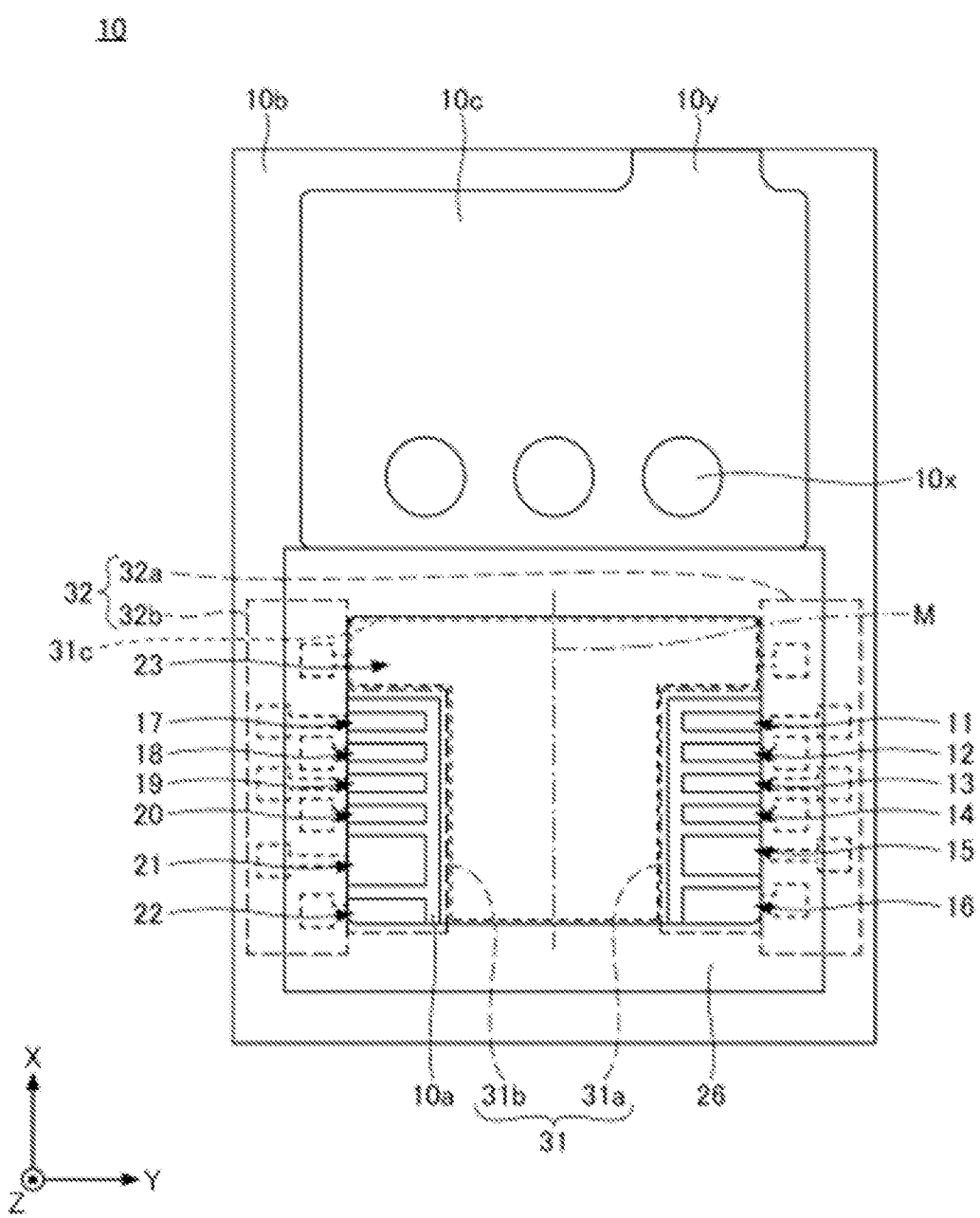
FIG. 3 is a schematic top view of the illustrative wiring board according to the first embodiment.
Figure 4:
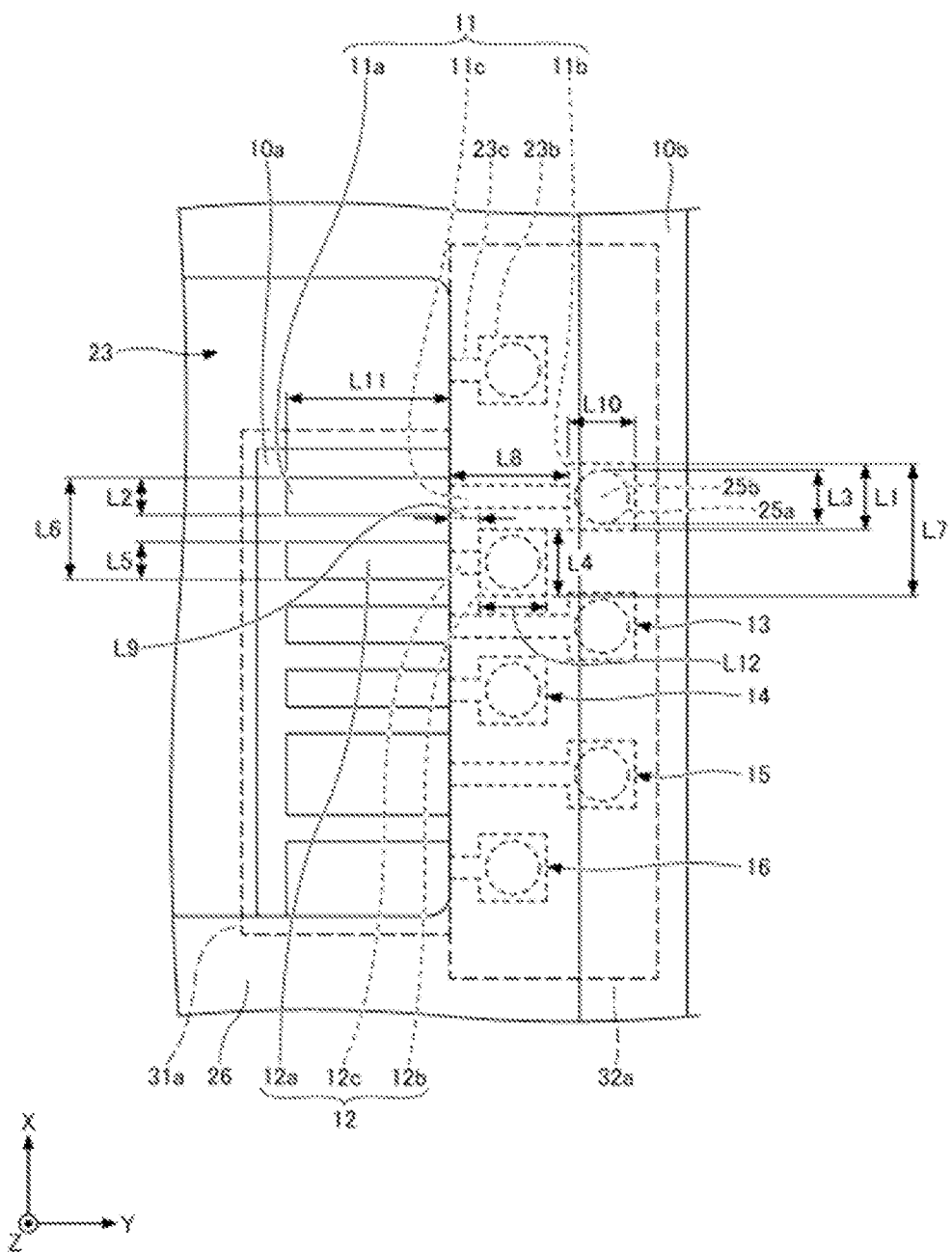
FIG. 4 is a schematic partial enlarged view of a first wiring region, a first connecting region, and their vicinities in FIG. 3.
Figure 5:
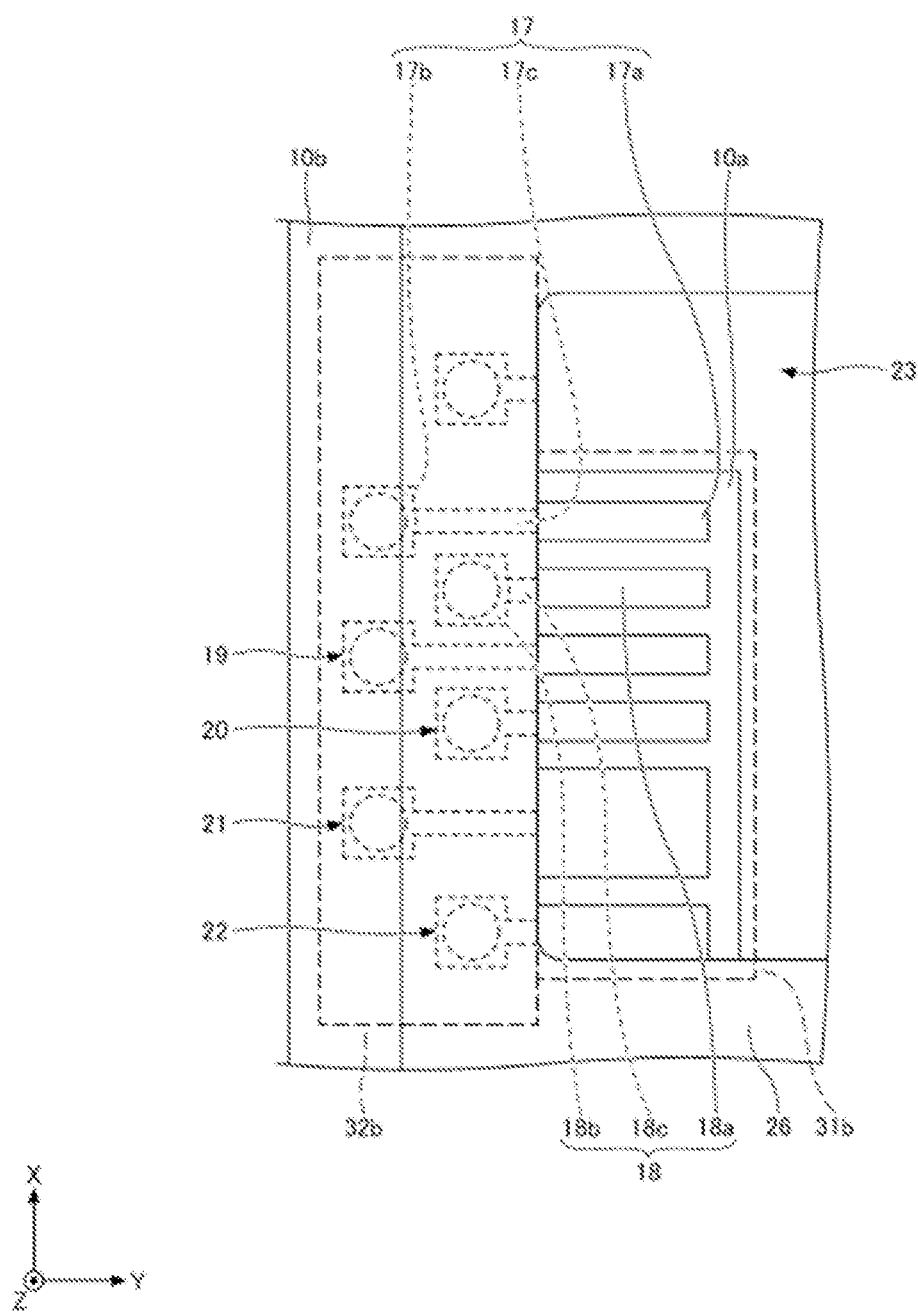
FIG. 5 is a schematic partial enlarged view of a second wiring region, a second connecting region, and their vicinities in FIG. 3.

FIG. 1 is a schematic perspective view of an illustrative wiring board according to a first embodiment. FIG. 2 is a schematic cross-sectional view taken along the line II-II of FIG. 1. FIG. 3 is a schematic top view of the illustrative wiring board according to the first embodiment. FIG. 4 is a schematic partial enlarged view of a first wiring region, a first connecting region, and their vicinities in FIG. 3. FIG. 5 is a schematic partial enlarged view of a second wiring region, a second connecting region, and their vicinities in FIG. 3.

As shown in FIG. 1 to FIG. 5, a wiring board 10 has a first upper surface 10a provided with a first wiring layer 11 and a second upper surface 10b located higher than the first upper surface 10a. The first upper surface 10a and the second upper surface 10b are flat surfaces. For example, the first upper surface 10a and the second upper surface 10b are parallel to each other. As used herein, the term "parallel" can include a deviation of ±5°.

The first upper surface 10a does not overlap with the second upper surface 10b in a top view and is exposed. In the present specification, the statement "a certain object is exposed" regarding the wiring board refers to a region of the wiring board in which the object is seen in a top view of the wiring board—that is, a region of the wiring board in which no portion other than that object is present directly above the object. For example, in the wiring board shown in the drawings, a region of the first upper surface 10a other than a region in which a wiring layer including the first wiring layer 11 is disposed is exposed. Whether a region is exposed is determined on the basis of the wiring board alone. For example, a region that becomes invisible in a top view due to mounting of other components in a light-emitting device may still be considered exposed with respect to the wiring board.

Figure 6:
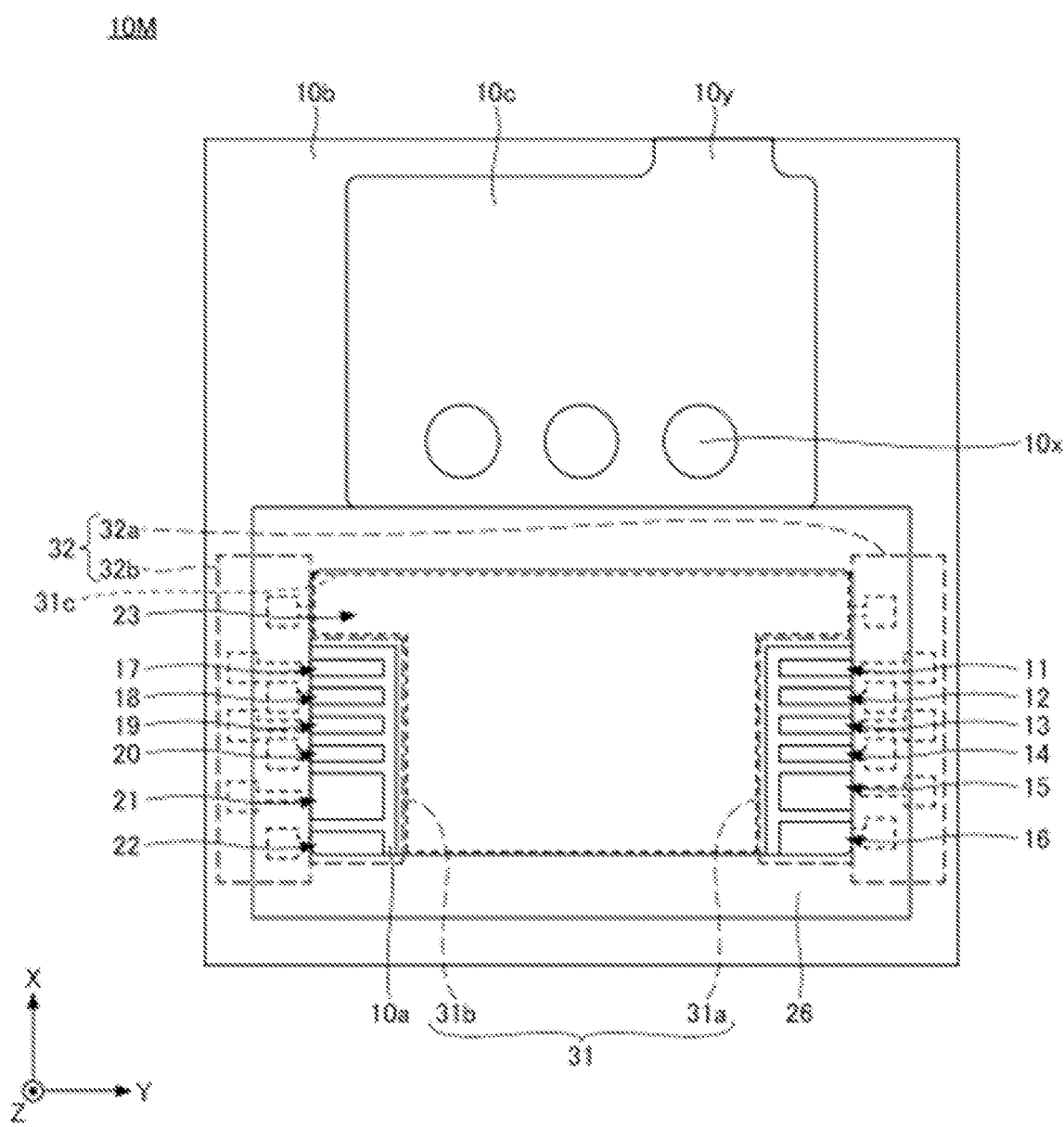
FIG. 6 is a schematic top view of another example of the constitution of the wiring board of the first embodiment.

The wiring board 10 shown in the drawings further has a third upper surface 10c located lower than the first upper surface 10a. The third upper surface 10c is a flat surface. For example, the third upper surface 10c and the first upper surface 10a are parallel to each other. As used herein, the term "parallel" can include a deviation of +5°. The second upper surface 10b includes a region between the first upper surface 10a and the third upper surface 10c in a top view. The first upper surface 10a includes a region surrounded by the second upper surface 10b in a top view. The first upper surface 10a also includes a region between the second upper surface 10b and the third upper surface 10c in a top view. The third upper surface 10c is not located between the first upper surface 10a and the second upper surface 10b because the second upper surface 10b is located between the third upper surface 10c and the first upper surface 10a in a top view. The third upper surface 10c includes a region surrounded by the second upper surface 10b in a top view. In a second direction Y, the length of the first upper surface 10a is shorter than the length of the third upper surface 10c in a top view. In the second direction Y, the length of the first upper surface 10a may be equal to the length of the third upper surface 10c or may be greater like a wiring board 10M shown in FIG. 6. The wiring board 10 may not have the third upper surface 10c.

In FIG. 1 to FIG. 5, an X-axis, a Y-axis, and a Z-axis orthogonal to one another are shown for reference. Directions parallel to the X-axis, the Y-axis, and the Z-axis are respectively referred to as a first direction X, the second direction Y, and a third direction Z. The first direction X and the second direction Y are parallel to the first upper surface 10a of the wiring board 10, and the third direction Z is perpendicular to the first upper surface 10a of the wiring board 10. Also, in FIG. 6 and the subsequent drawings, the X-axis, the Y-axis, and the Z-axis are shown as appropriate.

The wiring board 10 further has a lower surface 10d and one or a plurality of lateral surfaces 10e. The lower surface 10d may be parallel to the first upper surface 10a and the second upper surface 10b. The wiring board 10 shown in the drawings has a rectangular shape in a top view and has four lateral surfaces 10e. Each lateral surface 10e of the wiring board 10 is parallel or perpendicular to the first direction X or the second direction Y in a top view.

The wiring board 10 may have one or a plurality of recesses 10x surrounded by the third upper surface 10c and depressed toward the lower surface 10d. For example, the recesses 10x can be used for positioning components in the case where the wiring board 10 is used in a light-emitting device or the like. One lateral surface 10e may have an opening 10y connected to the second upper surface 10b and the third upper surface 10c. For example, the opening 10y may be used as a region through which light passes in the case where the wiring board 10 is used in a light-emitting device or the like.

One or a plurality of wiring layers are provided in the first upper surface 10a. The first upper surface 10a has a wiring region 31 in which the one or a plurality of wiring layers are disposed in a top view. A straight line connecting middle points of the two sides of the first upper surface 10a extending in the second direction Y in FIG. 3 is referred to as a median line M. In the example of the wiring board 10 shown in FIG. 3, the wiring region 31 includes a first wiring region 31a located in one of two portions of the first upper surface 10a divided by the median line M and a second wiring region 31b located in the other portion. The first wiring region 31a and wiring layers disposed in the first wiring region 31a do not intersect the median line M. Similarly, the second wiring region 31b and wiring layers disposed in the second wiring region 31b do not intersect the median line M. In the example shown in the drawings, the wiring board 10 further includes a metal region 31c lying astride the median line M separately from the wiring region 31. For example, one wiring layer is disposed in the metal region 31c. The metal region 31c intersects the median line M.

The wiring board 10 has a connecting region 32 that is connected to the wiring region 31, overlaps with the second upper surface 10b in a top view, and is not exposed. The entire connecting region 32 overlaps with the second upper surface 10b and is not exposed from the second upper surface 10b. The wiring region 31 and the connecting region 32 may be located in the same plane. In the example of the wiring board 10 shown in the drawings, the connecting region 32 includes a first connecting region 32a and a second connecting region 32b. The first connecting region 32a is connected to the first wiring region 31a at the boundary between the first upper surface 10a and the second upper surface 10b and extends in the first direction. The second connecting region 32b is connected to the second wiring region 31b at the boundary between the first upper surface 10a and the second upper surface 10b and extends in the first direction X. The metal region 31c is connected to one or both of the first connecting region 32a and the second connecting region 32b.

The wiring board 10 may not have the metal region 31c, and the wiring layer may not be disposed in the metal region 31c. The wiring board 10 may have only one of the combination of the first wiring region 31a and the first connecting region 32a and the combination of the second wiring region 31b and the second connecting region 32b.

The first wiring layer 11 extends in the second direction Y as shown in FIG. 4. Specifically, the first wiring layer 11 extends from the first wiring region 31a to the first connecting region 32a. The first wiring layer 11 includes a first pad portion 11a located in the first wiring region 31a and a first pattern portion 11b located in the first connecting region 32a. The first pattern portion 11b is disposed in the first connecting region 32a located under the second upper surface 10b of the wiring board 10 and is not exposed to the outside. In the example shown in the drawings, the first pattern portion 11b is disposed in the first connecting region 32a located directly below the second upper surface 10b.

In the first direction X perpendicular to the second direction Y in which the first wiring layer 11 extends, a length L1 of the first pattern portion 11b is greater than a length L2 of the first pad portion 11a. The length L1 of the first pattern portion 11b is, for example, 50 μm or more and 1,000 μm or less. The length L2 of the first pad portion 11a is, for example, 20 μm or more and 500 μm or less.

As described above, in the wiring board 10, the first pattern portion 11b is disposed in the first connecting region 32a located under the second upper surface 10b. In the first wiring region 31a, the first pad portion 11a having the length L2 in the first direction X shorter than the length L1 of the first pattern portion 11b in the first direction X is disposed. The first wiring layer 11 can therefore be disposed on the first upper surface 10a such that the length of the first wiring region 31a in the first direction X is shorter than in the case in which the first pattern portion 11b is disposed in the first wiring region 31a. The wiring board 10 can thus be miniaturized in the first direction X.

In the second direction Y, a length L10 of the first pattern portion 11b is shorter than a length L11 of the first pad portion 11a. The relationship between the length L10 of the first pattern portion and the length L11 of the first pad portion in the second direction Y in terms of size is not limited to the above. The length L10 of the first pattern portion 11b is, for example, 50 μm or more and 1,000 μm or less. The length L11 of the first pad portion 11a is, for example, 50 μm or more and 1,500 μm or less.

The wiring board 10 has a through hole 25a extending from below the first pattern portion 11b to the first pattern portion 11b. The first pattern portion 11b encompasses the outer periphery of the through hole 25a in a top view. That is, the first pattern portion 11b has a greater area than the through hole 25a in a top view, and the length L1 in the first direction X and the length L10 in the second direction Y of the first pattern portion 11b are greater than a length L3 of the through hole 25a. The lengths L1 and L10 are shorter than a length determined by adding 300 μm to the length L3 of the through hole 25a. The lengths are more preferably shorter than a length determined by adding 200 μm to the length L3 of the through hole 25a. With such a length, an increase in the size of the first pattern portion can be reduced. In the example shown in the drawings, the through hole 25a extends in a direction perpendicular to the first upper surface 10a. The direction of extension of the through hole 25a is not limited to the above direction. Even when a metal material is disposed in the through hole 25a as described below, the statement "the wiring board 10 has the through hole 25a" is regarded to be true as long as the through hole 25a is formed in a main material of the wiring board 10.

An electroconductive member such as a metal is further disposed in the through hole 25a. The wiring board 10 is thus connected to the first pattern portion 11b and includes a via wiring 25b disposed in the through hole 25a. The first pattern portion 11b is electrically connected to a metal film 27 disposed on the lower surface 10d of the wiring board 10 through the via wiring. In the example shown in the drawings, the via wiring 25b is connected to the metal film 27 disposed on the lower surface 10d of the wiring board 10 on the side opposite to the side on which the via wiring 25b is connected to the first pattern portion 11b. As described above, the first pattern portion 11b is connected through the via wiring to other wiring layers (such as the metal film 27) that are not located in the same plane as the first pattern portion 11b. The first pad portion 11a and the metal film 27 can thus be connected together without increasing the length of the first pad portion 11a in the first direction.

For example, the through hole 25a has a circular shape, an elliptic shape, or a rectangular shape in a top view. The length L2 of the first pad portion 11a is shorter than the length L3 of the through hole 25a in the first direction X. In consideration of ease of formation, for example, the length L3 of the through hole 25a is preferably 40 μm or more and 1,000 μm or less. The length L2 of the first pad portion 11a is preferably shorter not only than the length L3 of the through hole 25a but also than the diameter of the through hole 25a in the case of a circular shape, the minor axis in the case of an elliptic shape, or the short sides in the case of a rectangular shape. With such a length, the length of the first upper surface 10a in the first direction X can be reduced.

As described above, the first pattern portion 11b having the length L1 in the first direction X greater than the length L3 of the through hole 25a in the first direction X is disposed in the first connecting region 32a. The first pad portion 11a having the length L2 in the first direction X shorter than the length L3 of the through hole 25a in the first direction X is disposed in the first wiring region 31a of the first upper surface 10a. As described above, also when the wiring board 10 has the through hole 25a, the first wiring layer 11 can be disposed such that the length of the first upper surface 10a in the first direction X is short.

In the example shown in the drawings, the first wiring layer 11 includes a first connecting portion 11c that is disposed in the first connecting region 32a and connects the first pad portion 11a and the first pattern portion 11b together. The first pad portion 11a may be directly connected to the first pattern portion 11b. In the example shown in the drawings, the first pad portion 11a, the first pattern portion 11b, and the first connecting portion 11c are located in the same plane. In the first direction X, the length of the first connecting portion 11c is shorter than the length L1 of the first pattern portion 11b and the length L2 of the first pad portion 11a. The relationships among the first pad portion 11a, the first pattern portion 11b, and the first connecting portion 11c in terms of the positions in the height direction (third direction Z) and in terms of magnitude of the lengths in the first direction X are not limited to the above relationships.

The wiring board 10 further includes a second wiring layer 12. The second wiring layer 12 extends in the second direction Y as with the first wiring layer 11. In the example of the wiring board 10 shown in the drawings, the second wiring layer 12 extends from the first wiring region 31a to the first connecting region 32a. The first wiring layer 11 and the second wiring layer 12 are arranged in a row in the first direction X. In a lateral view in the first direction X, a large portion of the second wiring layer 12 overlaps with the first wiring layer 11. The second wiring layer 12 includes a second pad portion 12a located in the first wiring region 31a and a second pattern portion 12b located in the first connecting region 32a. The second wiring layer 12 further includes a second connecting portion 12c connecting the second pad portion 12a and the second pattern portion 12b together. The relationship among the second pad portion 12a, the second pattern portion 12b, and the second connecting portion 12c in terms of size in the first direction X can be equal to the relationship among the first pad portion 11a, the first pattern portion 11b, and the first connecting portion 11c in terms of size in the first direction X.

A length L4 of the second pattern portion 12b is, for example, 50 μm or more and 1,000 μm or less in the first direction X. A length L5 of the second pad portion 12a is, for example, 20 μm or more and 500 μm or less. The second pad portion 12a and the second pattern portion 12b can have the same lengths as the first pad portion 11a and the first pattern portion 11b in the second direction Y.

The sum (L1+L4) of the lengths of the first pattern portion 11b and the second pattern portion 12b is greater than the sum (L2+L5) of the lengths of the first pad portion 11a and the second pad portion 12a in the first direction X. The first pattern portion 11b and the second pattern portion 12b are disposed in the first connecting region 32a, so that wiring board 10 in which the first wiring layer 11 and the second wiring layer 12 are arranged in a row can also be miniaturized in the first direction X.

In the first direction X, a distance L6 is shorter than a total length determined by adding the sum (L1+L4) to a shortest distance to which the first pad portion 11a and the second pad portion 12a can approach each other. The distance L6 is a distance between a first point of the first pad portion 11a farthest from the second pad portion 12a and a second point of the second pad portion 12a farthest from the first pad portion 11a. An example of a numerical value obtained on the basis of the shortest distance is 20 μm. For example, the distance L6 is 60 μm or more and 1,020 μm or less. For example, the shortest interval between the first wiring layer 11 and the second wiring layer 12 is 20 μm.

The first pattern portion 11b and the second pattern portion 12b are disposed in the first connecting region 32a. This arrangement can reduce the size of the wiring board 10 in the first direction X by at least the difference between the length (L1+L4)+20 μm and the distance L6 compared with the case in which the first pattern portion 11b and the second pattern portion 12b are disposed in the first wiring region 31a. As in the example shown in the drawings, the distance L6 is preferably less than (L1+L4). The wiring board 10 can thus be further miniaturized in the first direction X.

A length L8 from the first pad portion 11a to the first pattern portion 11b is greater than a length L9 from the second pad portion 12a to the second pattern portion 12b in the second direction Y. The length L8 is greater than a length L12 of the second pattern portion 12b in the second direction Y. In the example shown in the drawings, L8 and L9 respectively correspond to the length of the first connecting portion 11c and the length of the second connecting portion 12c. The length L8 is preferably greater than the sum L9+L12 of the lengths of the second pattern portion 12b and the second connecting portion 12c in the second direction Y. With such lengths, the first pattern portion 11b and the second pattern portion 12b do not overlap with each other in a lateral view in the first direction X. The first pattern portion 11b and the second pattern portion 12b have lengths respectively greater than the first pad portion 11a and the second pad portion 12a in the first direction X. The second pattern portion 12b can thus be disposed closely to the first connecting portion 11c, so that the wiring board 10 can be miniaturized in the first direction X. For example, the length L8 is 200 μm or more and 2,000 μm or less. For example, the length L9 is shorter than the length L8 and is 100 μm or more and 1,800 μm or less.

In the first direction X, a distance L7 can be equal to or less than the sum (L1+L4). The distance L7 is a distance between a third point of the first pattern portion 11b farthest from the second pattern portion 12b and a fourth point of the second pattern portion 12b farthest from the first pattern portion 11b. For example, the distance L7 is 50 μm or more and 1,000 μm or less.

As described above, the second pattern portion 12b is disposed within a region in which the second pattern portion 12b overlaps with the first connecting portion 11c as viewed in the first direction X. In addition, the second pattern portion 12b includes a portion overlapping with the first pattern portion 11b as viewed in the second direction Y. The wiring board 10 can thus be miniaturized in the first direction X.

As shown in FIG. 1 and FIG. 2, the wiring board 10 may further have an inner lateral surface 10f connected to the first upper surface 10a at the boundary between the wiring region 31 and the connecting region 32. The inner lateral surface 10f intersects the second upper surface 10b. The inner lateral surface 10f may be perpendicular to the first upper surface 10a. This structure can miniaturize the wiring board 10 in the first direction X and the second direction Y compared with the case in which the inner lateral surface 10f is an inclined surface that is broader on the second upper surface 10b side.

The wiring board 10 may include a third wiring layer 13, a fourth wiring layer 14, a fifth wiring layer 15, and a sixth wiring layer 16 in the first wiring region 31a. As with the first wiring layer 11 and the second wiring layer 12, the third wiring layer 13, the fourth wiring layer 14, the fifth wiring layer 15, and the sixth wiring layer 16 include pad portions, connecting portions, and pattern portions. The pad portions extend in the second direction Y and are disposed in the first wiring region 31a. The connecting portions are disposed in the first connecting region 32a. The third wiring layer 13, the fourth wiring layer 14, the fifth wiring layer 15, and the sixth wiring layer 16 may not include the connecting portions. In the example shown in the drawings, the third wiring layer 13 and the fourth wiring layer 14 can respectively have the same lengths as the first wiring layer 11 and the second wiring layer 12 in the first direction X and the second direction Y. A plurality of wiring layers disposed in the first wiring region 31a can include a wiring layer in which the length of the pad portion is equal to or greater than the length of the pattern portion in the first direction X. In the example shown in the drawings, with regard to the fifth wiring layer 15 and the sixth wiring layer 16, the pad portions are longer than the respective pattern portions in the first direction X. With such lengths, for example, members having large lengths in the first direction X can be disposed on the pad portions of the fifth wiring layer 15 and the sixth wiring layer 16.

Subsequently, a seventh wiring layer 17 disposed in the second wiring region 31b and an eighth wiring layer 18 disposed in the second connecting region 32b will be described. The seventh wiring layer 17 extends in the second direction Y. The seventh wiring layer includes a seventh pad portion 17a disposed in the second wiring region 31b and a seventh pattern portion 17b disposed in the second connecting region 32b. Further, the seventh wiring layer 17 can include a seventh connecting portion 17c that connects the seventh pad portion 17a and the seventh pattern portion 17b together. Similarly, the eighth wiring layer 18 extends in the second direction Y. The eighth wiring layer 18 includes an eighth pad portion disposed in the second wiring region 31b and an eighth pattern portion 18b disposed in the second connecting region 32b. Further, the eighth wiring layer 18 can include an eighth connecting portion 18c that connects the eighth pad portion 18a and the eighth pattern portion 18b together. The seventh wiring layer 17 and the eighth wiring layer 18 can be disposed symmetrically to the first wiring layer 11 and the second wiring layer 12 about the median line M. The arrangement of the seventh wiring layer 17 and the eighth wiring layer 18 is not limited to the above arrangement.

In the first direction X, lengths of the seventh pad portion 17a and the seventh pattern portion 17b can be equal to respective lengths of the eighth pad portion 18a and the eighth pattern portion 18b. In the first direction X, the lengths of the seventh pad portion 17a and the seventh pattern portion 17b can be equal to the respective lengths of the first pad portion 11a and the first pattern portion 11b. The lengths of the eighth pad portion 18a and the eighth pattern portion 18b can be equal to the respective lengths of the second pad portion 12a and the second pattern portion 12b.

A ninth wiring layer 19, a tenth wiring layer 20, an eleventh wiring layer 21, and a twelfth wiring layer 22 can further be disposed in the second wiring region 31b. The ninth wiring layer 19, the tenth wiring layer 20, the eleventh wiring layer 21, and the twelfth wiring layer 22 can each extend in the second direction Y. These wiring layers can each include a pad portion disposed in the second wiring region 31b, a pattern portion, and a connecting portion disposed in the second connecting region 32b. Each the connecting portion connects the pad portion and the pattern portion together, in the second connecting region 32b.

In the first direction X, the lengths of the pad portion and the pattern portion of the ninth wiring layer 19 can be equal to the respective lengths of the pad portion and the pattern portion of the third wiring layer 13. Similarly, in the first direction X, the lengths of the pad portion and the pattern portion of the tenth wiring layer 20 can be equal to the respective lengths of the pad portion and the pattern portion of the fourth wiring layer 14. In the first direction X, the lengths of the pad portions of the seventh wiring layer 17 to the tenth wiring layer 20 are shorter than the lengths of the respective pattern portions.

In the first direction X, the length of the pad portion of the eleventh wiring layer 21 differs from the length of the pad portion of the fifth wiring layer 15. In the example shown in the drawings, the length of the pad portion of the eleventh wiring layer 21 is greater than the length of the pad portion of the fifth wiring layer 15. In the first direction X, the length of the pad portion of the twelfth wiring layer 22 differs from the length of the pad portion of the sixth wiring layer 16. In the example shown in the drawings, the length of the pad portion of the twelfth wiring layer 22 is shorter than the length of the pad portion of the sixth wiring layer 16 in the first direction X. In the first direction X, the length of the pad portion of the eleventh wiring layer 21 is greater than the length of the pattern portion. The length of the pad portion of the twelfth wiring layer 22 is shorter than the length of the pattern portion. With such lengths, for example, a member having a large length in the first direction X can be disposed on the eleventh wiring layer 21, and a member having a short length in the first direction X can be disposed on the twelfth wiring layer 22.

In the wiring board 10, a frame-shaped metal film 26 can be disposed in a region of the second upper surface 10b. The frame-shaped metal film 26 surrounds the first upper surface 10a in a top view. By disposing the metal film 26, for example, a member such as a cap can be bonded in the case where the wiring board 10 is used for a light-emitting device. One or a plurality of metal films 27 can be disposed on the lower surface 10d. By connecting the metal film 27 to the wiring layer through the via wiring, the metal film 27 can serve as a terminal for connection to an external circuit. Examples of materials of the metal films 26 and 27 include nickel, gold, titanium, platinum, copper, aluminum, iron, copper-molybdenum, copper-tungsten, and tungsten. The surfaces of the materials may be plated with Ni/Au (metal films layered in the order of Ni and Au), Ti/Pt/Au (metal films layered in the order of Ti, Pt, and Au), or the like.

Each of the wiring layers including the first wiring layer 11 may include a portion overlapping with the metal film 26 in a top view. In the example shown in the drawings, each of the wiring layers disposed in the connecting region 32 overlaps with the metal film 26 in a top view. A main material, which is an insulating member described below, of the wiring board is disposed between each wiring layer and the metal film 26, so that the wiring layer and the metal film 26 are not in direct contact with or electrically connected to each other. Each wiring layer is disposed by effectively using the region overlapping with the metal film 26 to which a member such as a cap is bonded in a top view, so that the wiring board 10 can be miniaturized in the second direction Y. The pattern portion of a wiring layer having a shorter length of the connecting portion of adjacent wiring layers in the same wiring region 31 overlaps with the metal film 26 in a top view. An area of a region in which the pattern portion of the wiring layer having a shorter length of the connecting portion and the metal film 26 overlap with each other in a top view is greater than an area of a region in which the pattern portion of the wiring layer having a greater length of the connecting portion and the metal film 26 overlap with each other. For example, a portion of the first pattern portion 11b of the first wiring layer 11 overlaps with the metal film 26 in a top view and another portion of the first pattern portion 11b does not overlap with the metal film 26 in a top view. The entire second pattern portion 12b of the second wiring layer 12 may overlap with the metal film 26 in a top view.

Subsequently, a thirteenth wiring layer 23 disposed in the metal region 31c will be described. The thirteenth wiring layer 23 intersects the median line M of the first upper surface 10a. In a top view, the thirteenth wiring layer 23 includes a portion located between the first wiring region 31a and the second wiring region 31b in the second direction Y and a portion located on the third upper surface 10c side with respect to the first wiring region 31a and the second wiring region 31b in the first direction X. For example, the thirteenth wiring layer 23 includes a thirteenth pattern portion 23b disposed in both or one of the first connecting region 32a and the second connecting region 32b and a thirteenth connecting portion 23c. In the example shown in the drawings, the thirteenth pattern portion 23b and the thirteenth connecting portion 23c are respectively disposed in the first connecting region 32a and the second connecting region 32b. The through hole 25a and the via wiring 25b connected the metal film 27 located on the lower surface 10d of the wiring board 10 are provided below the thirteenth pattern portion 23b. For example, the via wiring is used as a conductive member used when electroplating is performed after the metallized wiring board 10 is calcined.

The wiring board 10 may be formed using a ceramic as the main material. Examples of the ceramic include aluminum nitride, silicon nitride, aluminum oxide, and silicon carbide. The main material of the wiring board 10 is, for example, an insulating member. Examples of a material of each of the wiring layers including the first wiring layer 11 and the second wiring layer 12 include nickel, gold, titanium, platinum, copper, aluminum, iron, copper-molybdenum, copper-tungsten, and tungsten. The surface of the pad portion of each wiring layer may be plated with Ni/Au (metal films layered in the order of Ni and Au), Ti/Pt/Au (metal films layered in the order of Ti, Pt, and Au), or the like.

When the main material of the wiring board 10 is a ceramic, for example, the wiring board 10 can be produced by layering green sheets including a ceramic material. Specifically, one or a plurality of through holes 25a are formed at desired positions of a base material formed by layering a plurality of green sheets, and electroconductive members such as a metal are embedded to form the via wirings. Further, the wiring board can be formed by forming an electroconductive paste in a region defined on the upper surface of the base material, layering a green sheet on the upper surface of the base material to cover a portion of the region in which the electroconductive paste has been formed, and calcining the product. The region metallized with the electroconductive paste can serve as the wiring layer, the region covered with the green sheet can serve as the pad portion, and the uncovered region can serve as the pattern portion or the connecting portion. In this case, the pad portion and the pattern portion are located in the same plane.

Electroplating can be further performed on the wiring layer of the wiring board 10 formed by calcination. Electroplating can be performed in an electrolytic solution with the via wiring formed in the through hole 25a being the electroconductive member. After performing electroplating, for example, a dicing step may be included. The method of forming the wiring board 10 is not limited to the above method. Formation from a material other than ceramics is possible, and electroplating may not be performed.

The pattern portion of the wiring layer formed as described above can bulge upward compared with other portion in the case in which the through hole 25a is formed directly below the pattern portion and in which an electroconductive member such as a metal is provided. This constitution is common to the wiring layers.

Second Embodiment

As a second embodiment, an example of a light-emitting device including the wiring board 10 according to the first embodiment will be described. The light-emitting device according to the second embodiment includes the wiring board, one or more light-emitting elements disposed on a first mounting surface, and one or a plurality of optical members disposed on a second mounting surface.

Figure 7:
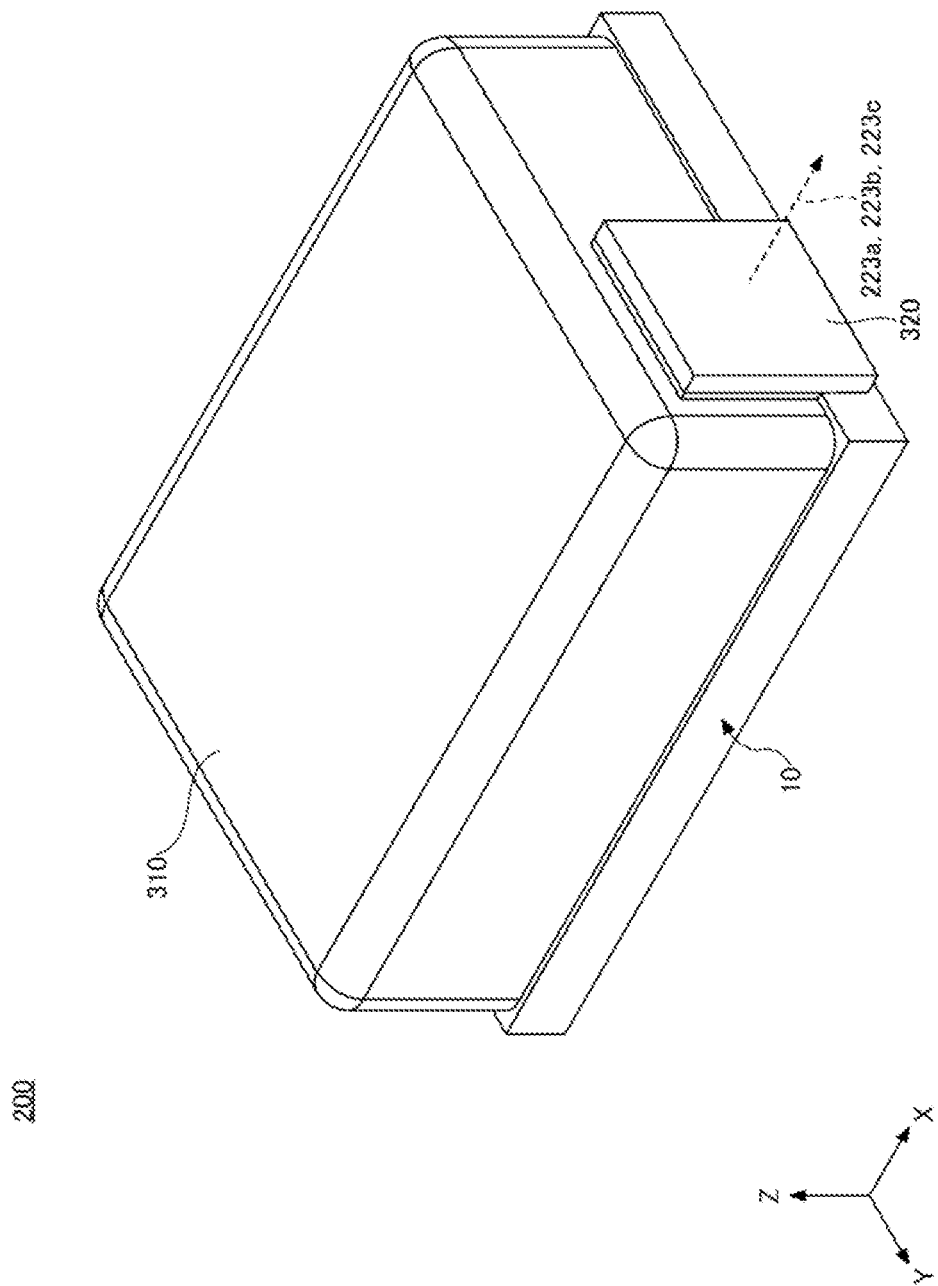
FIG. 7 is a schematic perspective view of an illustrative light-emitting device according to a second embodiment.
Figure 8:
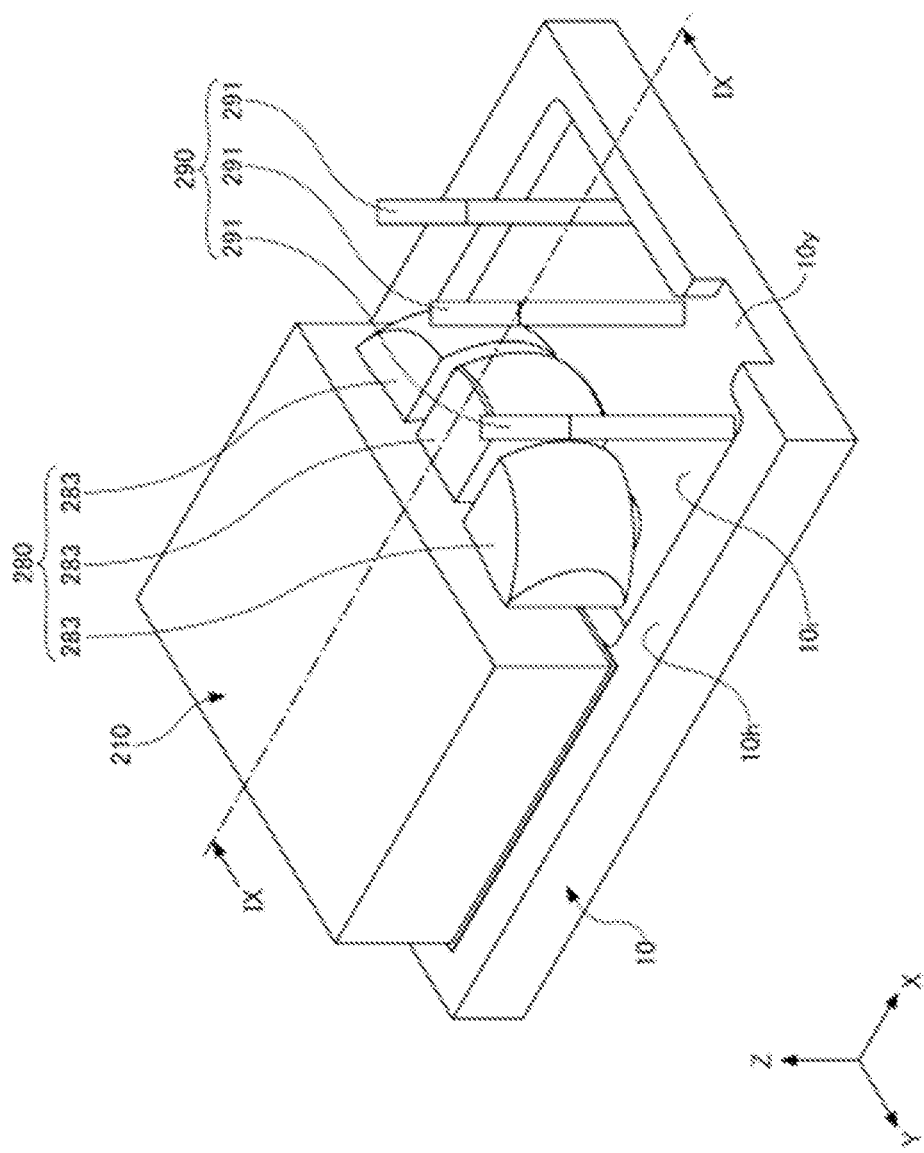
FIG. 8 is a schematic perspective view of a state in which a second cap and a lid member have been removed from the light-emitting device according to the second embodiment.
Figure 9:
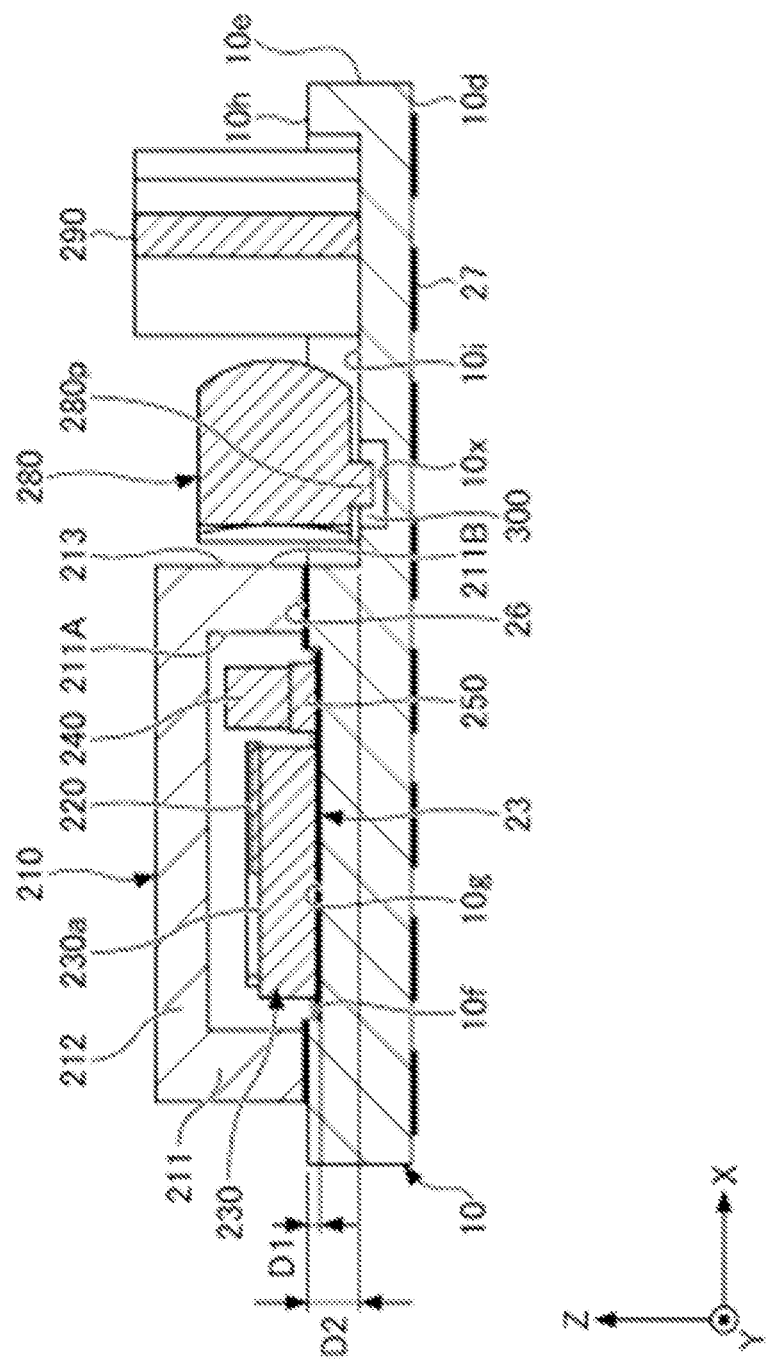
FIG. 9 is a schematic cross-sectional view taken along the line IV-IV of FIG. 8.
Figure 10:
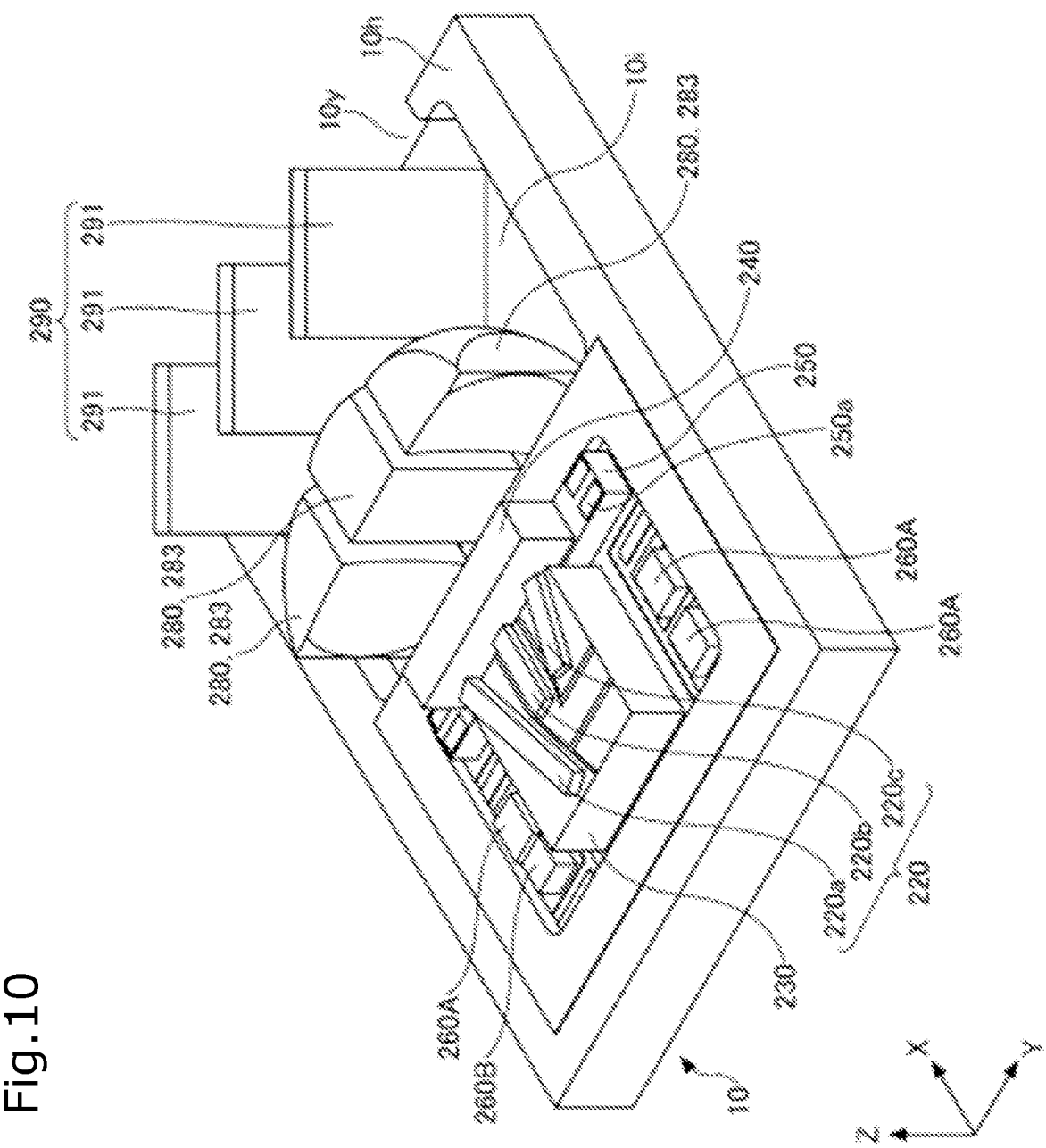
FIG. 10 is a schematic perspective view of a state in which a first cap, the second cap, and the lid member have been removed from the light-emitting device according to the second embodiment.
Figure 11:
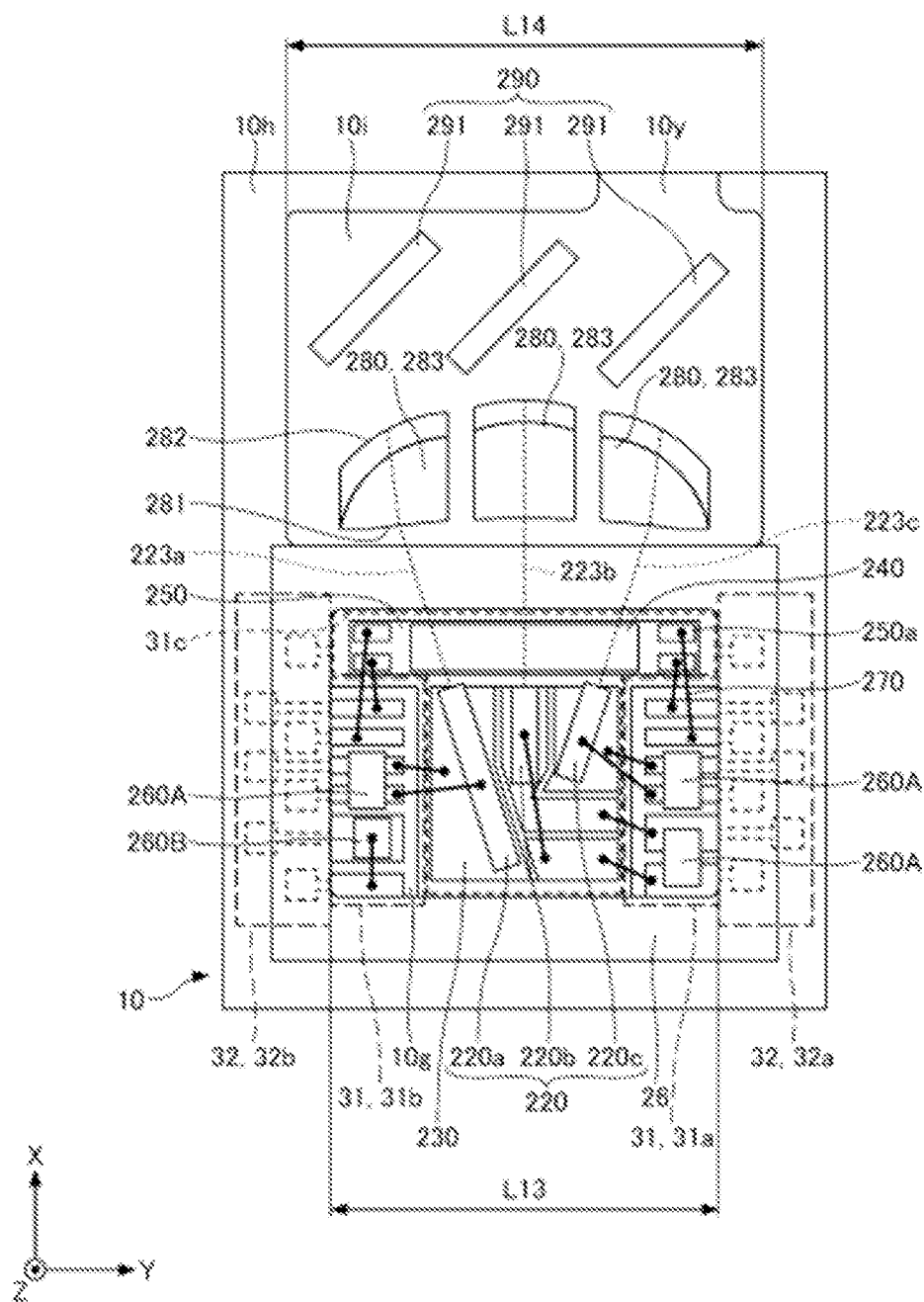
FIG. 11 is a schematic top view corresponding to the schematic perspective view of FIG. 10.
Figure 12:
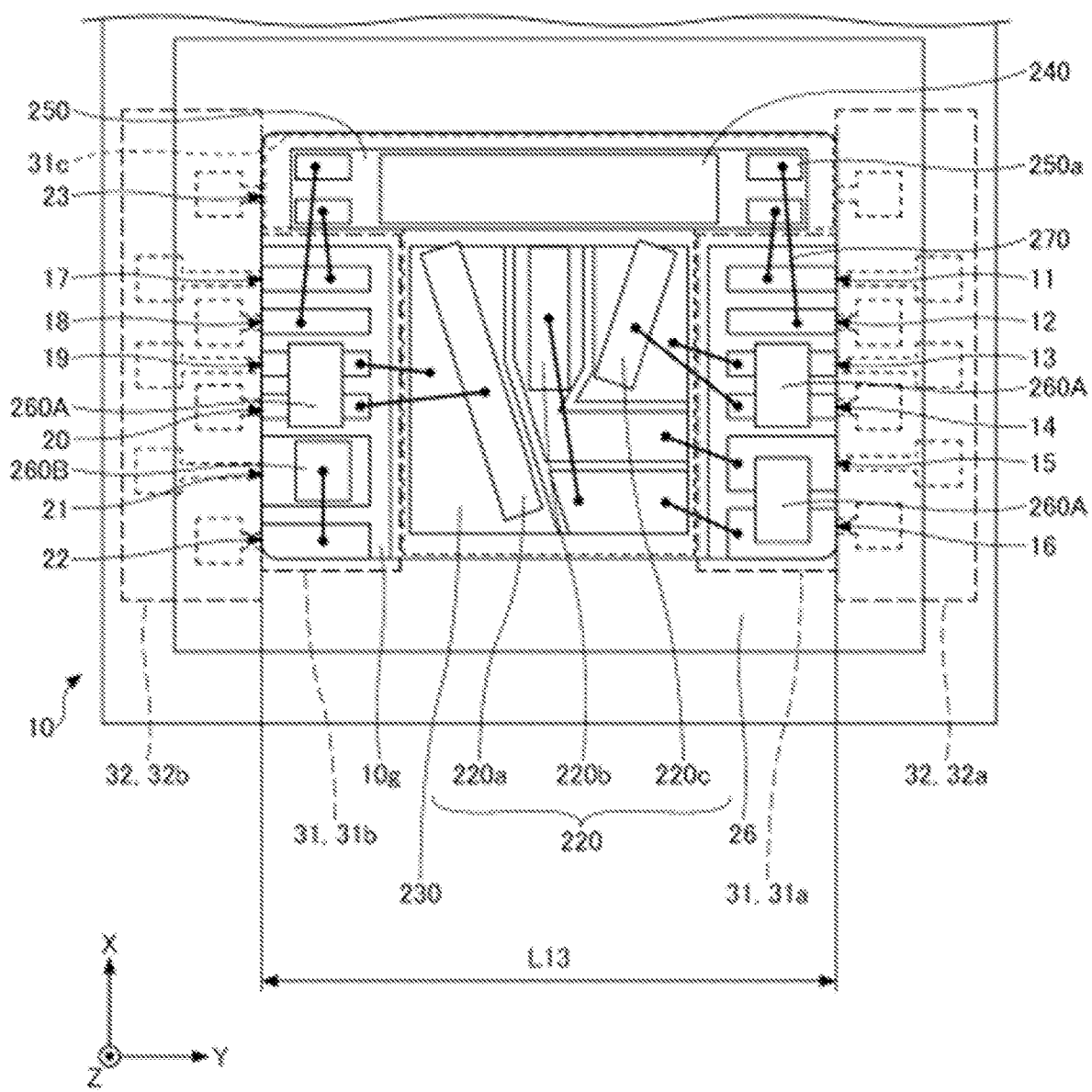
FIG. 12 is a schematic partial enlarged view of a first upper surface and a second upper surface around the first upper surface in FIG. 11.

An example of the light-emitting device according to the second embodiment will be described below referring to FIG. 7 to FIG. 12. FIG. 7 is a schematic perspective view of an illustrative light-emitting device according to the second embodiment. FIG. 8 is a schematic perspective view of a state in which a second cap and a lid member have been removed from the light-emitting device according to the second embodiment. FIG. 9 is a schematic cross-sectional view taken along the line IV-IV of FIG. 8. FIG. 10 is a schematic perspective view of a state in which a first cap, the second cap, and the lid member have been removed from the light-emitting device according to the second embodiment. FIG. 11 is a schematic top view corresponding to the schematic perspective view of FIG. 10. FIG. 12 is a schematic partial enlarged view of the first upper surface and the second upper surface around the first upper surface in FIG. 11.

A light-emitting device 200 shown in the drawings is an example of the light-emitting device according to the second embodiment. The light-emitting device 200 shown in the drawings includes the wiring board 10. The light-emitting device 200 shown in the drawings includes a lens member 280 as an example of the optical member, but the optical member is not limited to the lens member 280. The light-emitting device 200 shown in the drawings further includes a first cap 210, a submount 230, an optical element 240, a photodetector 250, a protective element 260A, a temperature measurement element 260B, a beam combiner 290, a second cap 310, and a lid member 320. These components are not essential.

In the light-emitting device 200 shown in the drawings, in a space defined by the wiring board 10 and the first cap 210, a plurality of light-emitting elements 220, the submount 230, the optical element 240, the photodetector 250, a plurality of protective elements 260A, and the temperature measurement element 260B are disposed. The lens member 280 and the beam combiner 290 are disposed outside this space.

The light-emitting device 200 of the present embodiment mostly has the shape of a box. For example, the length in the first direction X can be 15 mm or less. For example, the length in the second direction Y can be 10 mm or less. For example, the length in the third direction Z can be 10 mm or less.

Each component will be first described.

(Wiring Board 10)

The wiring board 10 is as described referring to the first embodiment. In the second embodiment, in the wiring board 10, a surface corresponding to the first upper surface 10a in the first embodiment is referred to as a first mounting surface 10g, a surface corresponding to the second upper surface 10b is referred to as an upper surface 10h, and a surface corresponding to the third upper surface 10c is referred to as a second mounting surface 10i for convenience.

That is, in the second embodiment, the wiring board 10 has the first mounting surface 10g provided with the wiring layers (such as the first wiring layer 11 shown in FIG. 3), the upper surface 10h located higher than the first mounting surface 10g, and the second mounting surface 10i located lower than the first mounting surface 10g. The upper surface 10h of the wiring board 10 includes a region between the first mounting surface 10g and the second mounting surface 10i in a top view. The first mounting surface 10g also includes the wiring region 31. In the second embodiment, the reference numeral of each wiring layer of the wiring board 10 is omitted except for some reference numerals, but the constitution of each wiring layer can be as shown in FIG. 3.

In the direction normal to the first mounting surface 10g of the wiring board 10, a distance D1 from the first mounting surface 10g to the upper surface 10h is shorter than a distance D2 from the second mounting surface 10i to the upper surface 10h. The distance D1 is preferably shorter than a distance (D2−D1) from the first mounting surface 10g to the second mounting surface 10i. With such height relationships, the height of the light-emitting device 200 in the third direction Z can be kept low by disposing a component having a relatively low height on the first mounting surface 10g and disposing a component having a relatively great height on the second mounting surface 10i. The distance D1 and the distance D2 can be equal to each other.

In the direction normal to the first mounting surface 10g, the distance D1 from the first mounting surface 10g to the upper surface 10h is, for example, 0.05 mm or more and 1.0 mm or less. The distance D2 from the second mounting surface 10i to the upper surface 10h is, for example, 0.05 mm or more and 1.05 mm or less. The distance (absolute value of D2−D1) from the first mounting surface 10g to the second mounting surface 10i is, for example, 0 mm or more and 1.0 mm or less. In the second direction Y, a length L13 of the first mounting surface 10g is shorter than a length L14 of the second mounting surface 10i in a top view.

(First Cap 210)

The first cap 210 includes a lateral wall portion 211 and an upper portion 212. The first cap 210 has a concave shape. The first cap 210 has a rectangular outer shape in a top view. The outer shape of the first cap 210 is not required to be a rectangular shape but may be, for example, a polygonal shape other than a quadrangular shape or a circular shape. The inner space surrounded by the wiring board 10, the lateral wall portion 211, and the upper portion 212 can be a sealed space. The inner space can be hermetically sealed.

The lateral wall portion 211 surrounds the first mounting surface 10g of the wiring board 10 and extends higher than the upper surface 10h. One or more components disposed on the first mounting surface 10g are surrounded by the lateral wall portion 211. The lateral wall portion 211 does not surround the second mounting surface 10i of the wiring board 10. One or more components disposed on the second mounting surface 10i are not surrounded by the lateral wall portion 211. The upper portion 212 is connected to the lateral wall portion 211 at a position higher than the upper surface 10h. The upper portion 212 is located directly above one or more components disposed on the first mounting surface 10g.

For example, the first cap 210 can be produced from a light-transmissive material such as glass, a plastic, quartz, and sapphire by a processing technique such as molding and etching. The first cap 210 may be formed by separately forming the upper portion 212 and the lateral wall portion 211 using different materials as main materials and bonding these portions. For example, the main material of the upper portion 212 can be a non-light-transmissive material such as a single-crystal silicon and polycrystalline silicon, and the main material of the lateral wall portion 211 can be a light-transmissive material such as glass.

The lateral wall portion 211 of the first cap 210 has a light-transmissive light incident surface 211A and a light-transmissive light extraction surface 211B. At least one of one or a plurality of outer lateral surfaces constituting the lateral wall portion 211 can serve as the light extraction surface 211B. The light extraction surface 211B can be perpendicular to the upper surface 10h. As used herein, the term "perpendicular" can include a difference of +5°. The light extraction surface 211B may be inclined with respect to the upper surface 10h.

At least a region of the light extraction surface 211B is light-transmissive. The light-transmissive region is referred to as a light-transmissive region 213 (see FIG. 9). The term "light-transmissive" refers to satisfaction of such a property that the transmittance of main incident light is 80% or more. The light-transmissive region 213 may extend on a plurality of outer lateral surfaces of the first cap 210. A region that is light-transmissive in the first cap 210 may not be limited to the light-transmissive region 213. In the example of the first cap 210 shown in the drawings, the first cap 210 has four outer lateral surfaces corresponding to the rectangular outer shape. All the four outer lateral surfaces are light-transmissive. One of the four outer lateral surfaces is the light extraction surface 211B.

(Light-Emitting Element 220)

An example of the light-emitting elements 220 is a semiconductor laser element (or a laser diode). The light-emitting element 220 can have an elongated rectangular outer shape in a top view. In the case where the light-emitting element 220 is an edge-emitting semiconductor laser element, a lateral surface intersecting one of the two short sides of the elongated rectangular shape is an emission end surface. The upper surface and the lower surface of the light-emitting element 220 have greater areas than the emission end surface. The light-emitting element 220 is not limited to an edge-emitting semiconductor laser element, and a surface-emitting semiconductor laser element such as a vertical-cavity surface-emitting laser (VCSEL) or a light-emitting diode (LED) may be employed.

The light-emitting element 220 in the present embodiment has one or more light-emitting points on the emission end surface. The light-emitting element 220 may be a single emitter having one light-emitting point on the emission end surface or may be a multi-emitter having two or more light-emitting points on the emission end surface. The example of the light-emitting element 220 shown in the drawings is a single emitter.

In the case in which the light-emitting element 220 is an edge-emitting semiconductor laser element, light (laser light) emitted from the emission end surface of the semiconductor laser element is a divergent beam having divergence. The laser beam forms an elliptic far-field pattern (hereinafter referred to as "FFP") in a plane parallel to the emission end surface. The FFP is the shape and the light intensity distribution of the emitted light at a position away from the emission end surface.

A beam passing through the center of the elliptic shape of the FFP, in other words, a beam showing a peak intensity in the light intensity distribution of the FFP is referred to as a beam traveling on the optical axis. The optical path of the beam traveling on the optical axis is referred to as the optical axis of the beam. In the present embodiment, a beam having an intensity of $1/e^2$ or more of the peak intensity in the light intensity distribution of the FFP is referred to as a "main portion" of light. A beam having an intensity of half or more of the peak intensity in the light intensity distribution of the FFP may be referred to as the "main portion" of light.

In the elliptic shape of the FFP of light emitted from the light-emitting element 220, which is a semiconductor laser element, the minor axis direction of the elliptic shape is referred to as a slow axis direction, and the major axis direction is referred to as a fast axis direction. A plurality of layers constituting the semiconductor laser element and including an active layer can be layered in the fast axis direction.

On the basis of the light intensity distribution of the FFP, the angle corresponding to $1/e^2$ of the light intensity distribution is referred to as the divergence angle of the beam of the semiconductor laser element. The divergence angle of the beam in the fast axis direction is referred to as the divergence angle in the fast axis direction, and the divergence angle of the beam in the slow axis direction is referred to as the divergence angle in the slow axis direction. The divergence angle of emission from the semiconductor laser element in the slow axis direction can be 3° or more.

For example, a semiconductor laser element that emits red light, a semiconductor laser element that emits green light, or a semiconductor laser element that emits blue light can be employed as the light-emitting element 220. The light-emitting element 220 may emit other light. The light-emitting element 220 may emit light other than visible light.

Blue light refers to light with a peak emission wavelength within the range of 420 nm to 494 nm. Green light refers to light with a peak emission wavelength within the range of 495 nm to 570 nm. Red light refers to light with a peak emission wavelength within the range of 605 nm to 750 nm.

Examples of the semiconductor laser element that emits blue light or the semiconductor laser element that emits green light include semiconductor laser elements including a nitride semiconductor. Examples of the nitride semiconductor include GaN, InGaN, and AlGaN. Examples of the semiconductor laser element that emits red light include elements including an InAlGaP, GaInP, GaAs, or AlGaAs semiconductor.

(Submount 230)

The submount 230 has an upper surface 230a and a lower surface opposite to the upper surface 230a and may have the shape of a rectangular parallelepiped. Each of the upper surface 230a and the lower surface functions as a bonding surface. The distance between the upper surface 230a and the lower surface is shorter than the distance between other two opposite surfaces. The shape of the submount 230 is not limited to the shape of a rectangular parallelepiped. For example, the submount 230 can be formed from silicon nitride, aluminum nitride, or silicon carbide. A metal film for bonding is provided on each of the upper surface 230a and the lower surface. The upper surface 230a can include one or a plurality of wiring regions electrically connected to other components.

(Optical Element 240)

The optical element 240 has a partial reflection surface. The partial reflection surface reflects a portion of incident light and transmits the other portion of the light. The partial reflection surface functions as a beam splitter. Light incident on the partial reflection surface is divided into two beams traveling in different directions. The divided two beams contain light with the same wavelength. The optical element 240 divides a component of the incident light having the same wavelength into two at a predetermined ratio. For example, one of the two beams divided by the optical element 240 can be used as a principal beam (hereinafter referred to as a "main beam"), and the other beam can be used as a beam for monitoring (hereinafter referred to as a "monitor beam") for controlling the main beam. The optical element 240 in the present embodiment can have the shape of a rectangular parallelepiped. One of the long sides on which the upper surface and the lateral surfaces intersect each other may have a notch. With such a notch, the orientation of the reflection surface can be easily determined to improve the ease of mounting.

When the incident light diverges into the main beam and the monitor beam, the intensity of the monitor beam is smaller than the intensity of the main beam. For example, the partial reflection surface transmits 80% or more and 99.5% or less of the incident light and reflects 0.5% or more and 20.0% or less of the incident light.

(Photodetector 250)

The photodetector 250 has a bonding surface, a light receiving surface, and a plurality of lateral surfaces. The light receiving surface is located opposite to the bonding surface. The outer shape of the photodetector 250 is the shape of a rectangular parallelepiped. The outer shape may be a shape other than the shape of the rectangular parallelepiped.

The light receiving surface has a rectangular outer shape, and a length of the light receiving surface in the second direction Y is greater than a length of the light receiving surface in the first direction X. The light receiving surface has a plurality of light receiving regions. Examples of the photodetector 250 having the light receiving surface include a photoelectric conversion element (photodiode) that outputs an electric signal corresponding to the intensity or the amount of incident light.

The photodetector 250 has a plurality of wiring regions 250a. The plurality of wiring regions 250a can be located on the light receiving surface. The plurality of wiring regions 250a may be located on a surface other than the light receiving surface, such as a lateral surface. The wiring regions 250a are electrically connected to the light receiving regions. The light receiving surface can be provided with wiring electrically connecting the wiring regions 250a to the light receiving regions.

(Protective Element 260A)

The protective elements 260A are circuit elements that prevent an excessive current from flowing through specific elements (such as the light-emitting elements 220) to break the specific elements. A typical example of the protective elements 260A is a voltage regulator diode such as a Zener diode. A Si diode can be employed as the Zener diode.

(Temperature Measurement Element 260B)

The temperature measurement element 260B is an element used as a temperature sensor for measuring the ambient temperature. For example, a thermistor can be used as the temperature measurement element 260B.

(Wiring 270)

A wiring 270 is constituted of an electric conductor having a linear shape having bonding portions at both ends. In other words, the wiring 270 includes bonding portions bonded to other components at both ends of the linear portion. For example, the wiring 270 is a metal wire. Examples of the metal include gold, aluminum, silver, and copper.

(Lens Member 280)

The lens member 280 collimates light emitted from the light-emitting elements 220. The lens member 280 includes a plurality of lens shapes 283. The individual lens shapes 283 are separated from one another. Each of the lens shapes 283 can have a lens surface 281 facing the light-emitting element 220 side in the traveling direction of light emitted from the light-emitting element 220 and a lens surface 282 located opposite to the lens surface 281. The lens surface 281 can serve as an incident surface, and the lens surface 282 can serve as an emission surface.

In the light-emitting device 200 shown in the drawings, the lens member 280 includes the plurality of lens shapes 283 each having one lens surface 282. In the present embodiment, the lens surfaces 282 can have, for example, different shapes according to the wavelengths of light passing through the lens surfaces 282. The lens member 280 can be formed of a light-transmissive material such as glass, a plastic, and a resin.

(Beam Combiner 290)

The beam combiner 290 aligns a plurality of incident light beams with the same axis to emit multiplexed light. The beam combiner 290 can have a structure in which a plurality of optical elements 291 are arranged. The optical elements 291 can be formed of a transparent material, such as glass and a plastic, that transmits visible light. For example, the optical elements 291 can be implemented using dichroic mirrors. The dichroic mirrors can be formed of dielectric multilayer films having predetermined wavelength selectivity. The dielectric multilayer films can be formed of $Ta_2O_5/SiO_2$, $TiO_2/SiO_2$, or $Nb_2O_5/SiO_2$. The plurality of optical elements 291 can be bonded together to form the beam combiner 290.

(Second Cap 310)

In the example of the light-emitting device 200 shown in the drawings, the second cap 310 has a concave shape. The outer shape of the second cap 310 has a rectangular shape in a top view. The second cap 310 encompasses the first cap 210 in a top view in the direction normal to the upper surface 10h of the wiring board 10. The second cap 310 is fixed to the wiring board 10. The second cap 310 is bonded to a peripheral region along the outer periphery of the upper surface 10h. The inner space of the second cap 310 is formed by bonding the second cap 310 to the wiring board 10. The inner space can be a sealed space. All of one or a plurality of components disposed on the upper surface 10h of the wiring board 10 can be housed in the inner space.

In the example of the second cap 310 shown in the drawings, an opening is provided at a position corresponding to the opening 10y of the wiring board 10 in a lateral view from the first direction X side. The second cap 310 can be formed of a light-shielding material that blocks light. For example, the second cap 310 can be produced by forming glass into the shape of the second cap 310 and disposing a light-shielding film on the surface.

(Lid Member 320)

The lid member 320 is light-transmissive. For example, the lid member 320 has the shape of a flat plate. The lid member 320 is bonded to the wiring board 10 and the second cap 310. The lid member 320 covers the opening of the second cap 310. By closing the opening of the second cap 310 with the lid member 320, the inner space defined by the second cap 310 can be a closed space.

(Light-emitting Device 200)

Subsequently, the light-emitting device 200 will be described.

In the light-emitting device 200 shown in the drawings, each of the light-emitting elements 220 is an edge-emitting semiconductor laser element. The light-emitting elements 220 can include a first light-emitting element 220a and a second light-emitting element 220b. The light-emitting elements 220 can further include a third light-emitting element 220c. The light-emitting elements 220 may include four or more light-emitting elements. As for the light-emitting elements 220, for example, the first light-emitting element 220a can be a semiconductor laser element that emits red light, the second light-emitting element 220b can be a semiconductor laser element that emits green light, and the third light-emitting element 220c can be a semiconductor laser element that emits blue light. The light-emitting elements 220 may include two or more light-emitting elements having the same peak emission wavelength.

In the light-emitting device 200 shown in the drawings, the plurality of light-emitting elements 220, the submount 230, the optical element 240, the photodetector 250, the protective elements 260A, and the temperature measurement element 260B are disposed on the first mounting surface 10g of the wiring board 10. The first cap 210 surrounds one or a plurality of members disposed on the first mounting surface 10g. The light-emitting elements 220 are disposed on the first mounting surface 10g with the submount 230 therebetween. The photodetector 250 is disposed on the first mounting surface 10g, and the optical element 240 is disposed on the light receiving surface of the photodetector 250. The optical element 240 and the photodetector 250 are disposed at a position between the light-emitting elements 220 and the first cap 210 to cross light emitted from the light-emitting elements 220. The light-emitting elements 220 and other members disposed on the first mounting surface 10g are hermetically sealed by the wiring board 10 and the first cap 210 or by the wiring board 10, the second cap 310, and the lid member 320. By hermetically sealing the space where the light-emitting elements 220 are disposed, deterioration in quality due to dust collection can be reduced.

In the light-emitting device 200 shown in the drawings, in a region of the first mounting surface 10g located on a lateral side of the submount 230 in the second direction Y, the wiring board 10 has the first wiring region 31a and the second wiring region 31b in regions that do not overlap with the upper surface 10h and are exposed in a top view. A plurality of wiring layers are disposed in the first wiring region 31a and the second wiring region 31b as shown in FIG. 3. The metal region 31c is further disposed between the first wiring region 31a and the second wiring region 31b. The metal region 31c includes one wiring layer. The wiring layer of the metal region 31c includes a portion located between the first wiring region 31a and the second wiring region 31b and a portion located on the second mounting surface 10i side with respect to the first wiring region 31a and the second wiring region 31b. The wiring board 10 shown in the drawings has the first connecting region 32a that is connected to the first wiring region 31a. The first connecting region 32a overlaps with the upper surface 10h in a top view and is not exposed. The wiring board 10 has the second connecting region 32b that is connected to the second wiring region 31b. The second connecting region 32b overlaps with the upper surface 10h in a top view and is not exposed.

The submount 230 is disposed in the metal region 31c of the first mounting surface 10g. More specifically, the submount 230 is disposed in the portion of the metal region 31c between the first wiring region 31a and the second wiring region 31b. The lower surface of the submount 230 is bonded to the first mounting surface 10g. The submount 230 can be bonded to the first mounting surface 10g with, for example, a metal adhesive containing Au particles and the like therebetween. The submount 230 supports the plurality of light-emitting elements 220. The plurality of light-emitting elements 220 are each bonded to the upper surface 230a of the submount 230 with, for example, a metal adhesive such as AuSn. At least one of the plurality of light-emitting elements 220 is disposed such that an optical axis is inclined with respect to an optical axis of an adjacent light-emitting element as described below.

One or a plurality of protective elements 260A can be disposed in the first wiring region 31a and/or the second wiring region 31b of the first mounting surface 10g. In the light-emitting device 200 shown in the drawings, three protective elements 260A respectively corresponding to three light-emitting elements 220 are disposed on the plurality of wiring layers disposed in the first wiring region 31a and the second wiring region 31b. One protective element 260A is disposed astride two wiring layers. More specifically, a protective element 260A is disposed astride the third wiring layer 13 and the fourth wiring layer 14. A protective element 260A is disposed astride the fifth wiring layer 15 and the sixth wiring layer 16. They are disposed in the first wiring region 31a. The other protective element 260A is disposed astride the ninth wiring layer 19 and the tenth wiring layer 20. In the first direction X, each of the protective element 260A protrudes from the pad portions of two wiring layers. With such an arrangement, the wiring board 10 and the light-emitting device 200 can be miniaturized in the first direction X. The length of each the protective elements 260A may be greater than the pattern portion of each the wiring layers in the first direction X. The length of each the protective elements 260A may be greater than the sum of the lengths of the pad portions of the third wiring layer 13 and the fourth wiring layer 14 in the first direction X. The length of each the protective elements 260A may be greater than the length of the pad portion of the fifth wiring layer 15 or the sixth wiring layer 16 in the first direction X.

The temperature measurement element 260B can be disposed in the first wiring region 31a and/or the second wiring region 31b of the first mounting surface 10g. In the light-emitting device 200 shown in the drawings, the temperature measurement element 260B is disposed on the pad portion of the eleventh wiring layer 21 in the second wiring region 31b. One end of the wiring 270 is bonded to the upper surface of the temperature measurement element 260B. The other end of the wiring 270 connected to the temperature measurement element 260B is bonded to the pad portion of the twelfth wiring layer 22. In the first direction X, the length of the temperature measurement element 260B is shorter than the length of the pad portion of the eleventh wiring layer 21 and greater than the length of the pattern portion of each wiring layer.

One of a p-side electrode and a n-side electrode of the light-emitting element 220 is electrically connected to the wiring region of the upper surface 230a of the submount 230. One end of the wiring 270 is electrically bonded to this wiring region of the upper surface 230a. The other end of the wiring 270 is electrically bonded to the wiring layer located in the first wiring region 31a and/or the second wiring region 31b.

In the light-emitting device 200 shown in the drawings, two wirings 270 are connected to the first light-emitting element 220a. Each one end of the two wirings 270 is respectively bonded to the pad portion of the ninth wiring layer 19 and the pad portion of the tenth wiring layer 20. Two wirings 270 are electrically connected to the second light-emitting element 220b. Each one end of the two wirings 270 is respectively bonded to the pad portion of the fifth wiring layer 15 and the pad portion of the sixth wiring layer 16. Two wirings 270 connected to the third light-emitting element 220c are bonded to the pad portion of the third wiring layer 13 and the pad portion of the fourth wiring layer 14.

The wiring layers to which each one end of the wirings 270 connected to a plurality of light-emitting elements 220 are bonded respectively correspond to the wiring layers astride which the protective elements 260A are disposed.

The optical element 240 and the photodetector 250 are disposed in the metal region 31c of the first mounting surface 10g. More specifically, they are disposed on the thirteenth wiring layer 23 disposed in the metal region 31c. In the example shown in the drawings, the lengths of the optical element 240 and the photodetector 250 are greater than the length of the submount 230 in the second direction Y. Correspondingly, the optical element 240 and the photodetector 250 are disposed in a portion of the metal region 31c on the second mounting surface 10i side with respect to the first wiring region 31a and the second wiring region 31b. As described above, by disposing the optical element 240 and the photodetector 250 in a portion longer than the portion of the metal region 31c in which the submount 230 is disposed in the second direction Y, the members can be efficiently arranged on the first upper surface 10a. The bonding surface of the photodetector 250 is bonded to the thirteenth wiring layer 23. For example, the photodetector 250 can be bonded to the thirteenth wiring layer 23 with a metal adhesive containing Au particles or the like.

When the submount 230, the optical element 240, and the photodetector 250 are disposed on the thirteenth wiring layer 23 disposed in the metal region 31c, the through hole 25a and the pattern portion of the thirteenth wiring layer 23 are preferably located in the connecting region 32. As described above, the pattern portion of the wiring layer can bulge with respect to the other portions of the wiring layer. By not providing the through hole 25a and the pattern portion in the metal region 31c in which the submount 230, the optical element 240, and the photodetector 250 are disposed, the members can be stably disposed. The pattern portion of the thirteenth wiring layer 23 is preferably disposed on the second mounting surface 10i side (positive direction of the first direction X) with respect to the pattern portion of each of the first wiring layer 11 and the twelfth wiring layer 22 in the first direction X. With such an arrangement, the distance to the portion of the thirteenth wiring layer 23 disposed in the metal region 31c can be reduced. The pattern portion of the thirteenth wiring layer 23 is preferably disposed on the first mounting surface 10g side (negative direction of the first direction X) with respect to the second mounting surface 10i in the first direction X. The length of the connecting region 32 in the first direction X can thus be reduced.

The wiring regions 250a of the photodetector 250 can be electrically connected to the wiring layers located in the first wiring region 31a and/or the second wiring region 31b through the wirings 270. In the example shown in the drawings, the photodetector 250 has four wiring regions 250a. The four wirings 270 bonded on the four wiring regions 250a are respectively bonded to the pad portion of the first wiring layer 11, the pad portion of the second wiring layer 12, the pad portion of the seventh wiring layer 17, and the pad portion of the eighth wiring layer 18. Only the wirings 270 are bonded to the first wiring layer 11, the second wiring layer 12, the seventh wiring layer 17, and the eighth wiring layer 18, and other members are not disposed.

The light-emitting device 200 may further include the first cap 210 that is bonded to the wiring board 10 and encapsulates the light-emitting elements 220. In the light-emitting device 200 shown in the drawings, the first cap 210 is mounted on the upper surface 10h to surround the light-emitting elements 220 and one or a plurality of other members disposed on the first mounting surface 10g. Specifically, the upper surface 10h of the wiring board 10 has a surrounding region surrounding the periphery of the first mounting surface 10g in a top view, and the first cap 210 is bonded to the metal film 26 of the wiring board 10 with a bonding member disposed in the surrounding region therebetween. Examples of the bonding member include solder such as AuSn.

In the wiring board 10, the pattern portion of each wiring layer overlaps with the first cap 210 in a top view. The wiring board may include a wiring layer including a pattern portion not overlapping. The wiring board 10 can include a wiring layer including a pattern portion that reaches the outside of the first cap in a top view. In the example shown in the drawings, the pattern portion of the first wiring layer 11 partially overlaps with the first cap 210 in a top view. A point of the pattern portion of the first wiring layer 11 farthest from the first mounting surface 10g is located outside the first cap 210. The point of the pattern portion of the first wiring layer 11 farthest from the first mounting surface 10g is located inside the second cap 310. The pattern portion of the first wiring layer 11 can partially overlap with the second cap 310 in a top view. With such an arrangement, the light-emitting device 200 can be miniaturized.

In the light-emitting device 200 shown in the drawings, the lens member 280 and the beam combiner 290 are disposed on the second mounting surface 10i of the wiring board 10. The lens member 280 and the beam combiner 290 are disposed in this order from the side close to the light-emitting elements 220. The lens member 280 receives light emitted from the light-emitting elements 220. The beam combiner 290 is disposed on the side farther from the light-emitting elements 220 than the lens member 280 and receives light emitted from the lens member 280. The lens member 280 may have a protrusion 280p. When the second mounting surface 10i has the recess 10x into which the protrusion 280p is to be inserted, the protrusion 280p is inserted into the recess 10x, and a resin 300 that bonds the lens member 280 and the wiring board 10 together can be disposed in the recess 10x. With the recess 10x, positioning of the lens member 280 can be performed. The light-emitting device 200 can be miniaturized in the third direction Z due to the protrusion 280p of the lens member 280 inserted into the recess 10x.

In a lateral view in the first direction X, the light-emitting point of the light-emitting element 220 disposed farthest from the lid member 320 does not overlap with the lid member 320. This structure can suppress leakage of light from unintended portions.

In the light-emitting device 200 shown in the drawings, light emitted from each light-emitting element 220 is incident on the optical element 240. A portion of light incident on the optical element 240 is reflected by the partial reflection surface and oriented to the light receiving region of the light receiving surface of the photodetector 250. Light incident on the light receiving region can be used as the monitor beam. A portion of light incident on the optical element 240 is transmitted through the partial reflection surface and emitted toward the lateral wall portion 211 of the first cap 210.

Light emitted from the optical element 240 is incident on the light incident surface 211A of the lateral wall portion 211, transmitted through the light-transmissive region 213, and emitted from the light extraction surface 211B. Light emitted from the light extraction surface 211B is incident on the lens surface 281 of the lens member 280. The main portion of light emitted from the light-emitting element 220 includes a portion located lower than the upper surface 10h when incident on the lens surface 281, which serves as the incident surface of the lens member 280.

Each of a plurality of beams collimated by the lens member 280 is incident on the beam combiner 290. The beams are combined on the same axis, and the multiplexed light is emitted from the beam combiner 290. The multiplexed light emitted from the beam combiner 290 is transmitted through the incident surface of the lid member 320 and emitted out of the light-emitting device 200 from the emission end surface of the lid member 320.

In the light-emitting device 200 of the present embodiment, adjacent light-emitting elements 220 are disposed on the submount 230 such that one is inclined with respect to the other. In the example shown in the drawings, the first light-emitting element 220a and the third light-emitting element 220c are inclined with respect to the second light-emitting element 220b.

The light-emitting points of the first light-emitting element 220a, the second light-emitting element 220b, and the third light-emitting element 220c are aligned along a side of the submount 230 parallel to the second direction Y in a top view. The second light-emitting element 220b is located between the first light-emitting element 220a and the third light-emitting element 220c in the second direction Y.

In FIG. 11, broken lines indicate an optical axis 223a of light emitted from the first light-emitting element 220a, an optical axis 223b of light emitted from the second light-emitting element 220b, and an optical axis 223c of light emitted from the third light-emitting element 220c. The second light-emitting element 220b is disposed such that the optical axis 223b is parallel to the first direction X. As used herein, the term "parallel" can include a difference of +2°.

The first light-emitting element 220a is disposed such that the optical axis 223a is inclined with respect to the optical axis 223b. The third light-emitting element 220c is disposed such that the optical axis 223c is inclined with respect to the optical axis 223b. In this arrangement, the optical axis 223a and the optical axis 223b are not parallel to each other, and the optical axis 223c and the optical axis 223b are not parallel to each other.

In the present specification, as for two optical axes, the term "parallel" can include a difference when the angle between two optical axes of adjacent light-emitting elements is not strictly 0°. Even in this case, the angle between two optical axes does not reach 3° or more. The term "not parallel" indicates that the angle between two optical axes of adjacent light-emitting elements is 3° or more.

The light emitting elements are arranged such that the optical axis 223a is not parallel to the optical axis 223b and the optical axis 223c is not parallel to the optical axis 223b. With such arrangement, the space in which the first light-emitting element 220a, the second light-emitting element 220b, and the third light-emitting element 220c are mounted can be reduced in the second direction Y. This space can therefore be secured even when the length L13 of the first mounting surface 10g is shorter than the length L14 of the second mounting surface 10i in the second direction Y in a top view.

The lens member 280 includes a plurality of separate lens shapes 283, so that the arrangement of the lens shapes 283 can be freely changed according to the inclination angles of the light-emitting elements 220. The lens shapes 283 can be disposed such that the main portions of the beams emitted from the first light-emitting element 220a, the second light-emitting element 220b, and the third light-emitting element 220c pass through the lens surfaces 282 of the respective lens shapes 283 according to the size of the wiring board and the inclination of the light-emitting elements.

The light-emitting device 200 includes the wiring board 10 and can therefore be miniaturized in the first direction X and the second direction Y.

In the light-emitting device 200, the light-emitting elements 220 and the optical element 240 are disposed on the first mounting surface 10g. The first mounting surface 10g is located lower than the upper surface 10h. The light-emitting elements 220 and the optical element 240 are disposed on the first mounting surface 10g, so that part of the wiring layers disposed on the first mounting surface 10g can be disposed below the upper surface 10h. Further, the heights from the upper surface 10h of the wiring board 10 to the upper surfaces of the light-emitting elements 220 and to the optical element 240 can be reduced. Accordingly, the light-emitting device 200 can be miniaturized in the third direction Z.

The distance D1 from the first mounting surface 10g to the upper surface 10h is 0.05 mm or more. This allows the upper surface of the first wiring layer or the like to be located lower than the upper surface 10h. The distance D1 is 1.0 mm or less, and this allows the light-emitting elements 220 to be disposed such that the main portions of beams emitted from the light-emitting elements 220 pass higher than the upper surface 10h. That allows the main portions of beams emitted from the light-emitting elements 220 to be prevented from being applied to the inner lateral surface 10f of the wiring board 10.

In the light-emitting device 200, the optical members such as the lens member 280 and the beam combiner 290 are disposed on the second mounting surface 10i. The second mounting surface 10i is located still lower than the first mounting surface 10g. The second mounting surface 10i is preferably the lowest plane of the wiring board 10. The optical member having a relatively great height such as the lens member 280 and the beam combiner 290 is disposed on the second mounting surface 10i. This allows the height from the upper surface 10h of the wiring board 10 to the upper surface of the optical member such as the lens member 280 and the beam combiner 290 to be kept low. Accordingly, the light-emitting device 200 can be miniaturized in the third direction Z.

The distance D2 from the second mounting surface 10i to the upper surface 10h is 0.05 mm or more. This allows the entire main portions of beams emitted from the light-emitting elements 220 to be taken into the lens member 280. For example, it can be considered a case that the main portions of beams include beams located lower than the upper surface 10h when he main portions of beams are emitted from the light-emitting elements 220 to be incident on the lens surfaces 281 which are the incident surfaces of the lens member 280. Even in that case, the entire main portions can be taken into the lens member 280.

The distance D2 from the second mounting surface 10i to the upper surface 10h is 1.05 mm or less. This allows the heights of the emission points of the light-emitting elements 220 to be roughly aligned with the heights of the optical axes of the respective lens shapes of the lens member 280.

Modification of Second Embodiment

As a modification of the second embodiment, an example of a light-emitting device including the wiring board 10M according to the first embodiment will be described. The light-emitting device according to the second embodiment includes the wiring board, one or more light-emitting elements disposed on the first mounting surface, and one or a plurality of optical members disposed on the second mounting surface. In the description below, the constitution different from the light-emitting device 200 according to the second embodiment is described, and the description of shared portions is omitted as appropriate.

Figure 13:
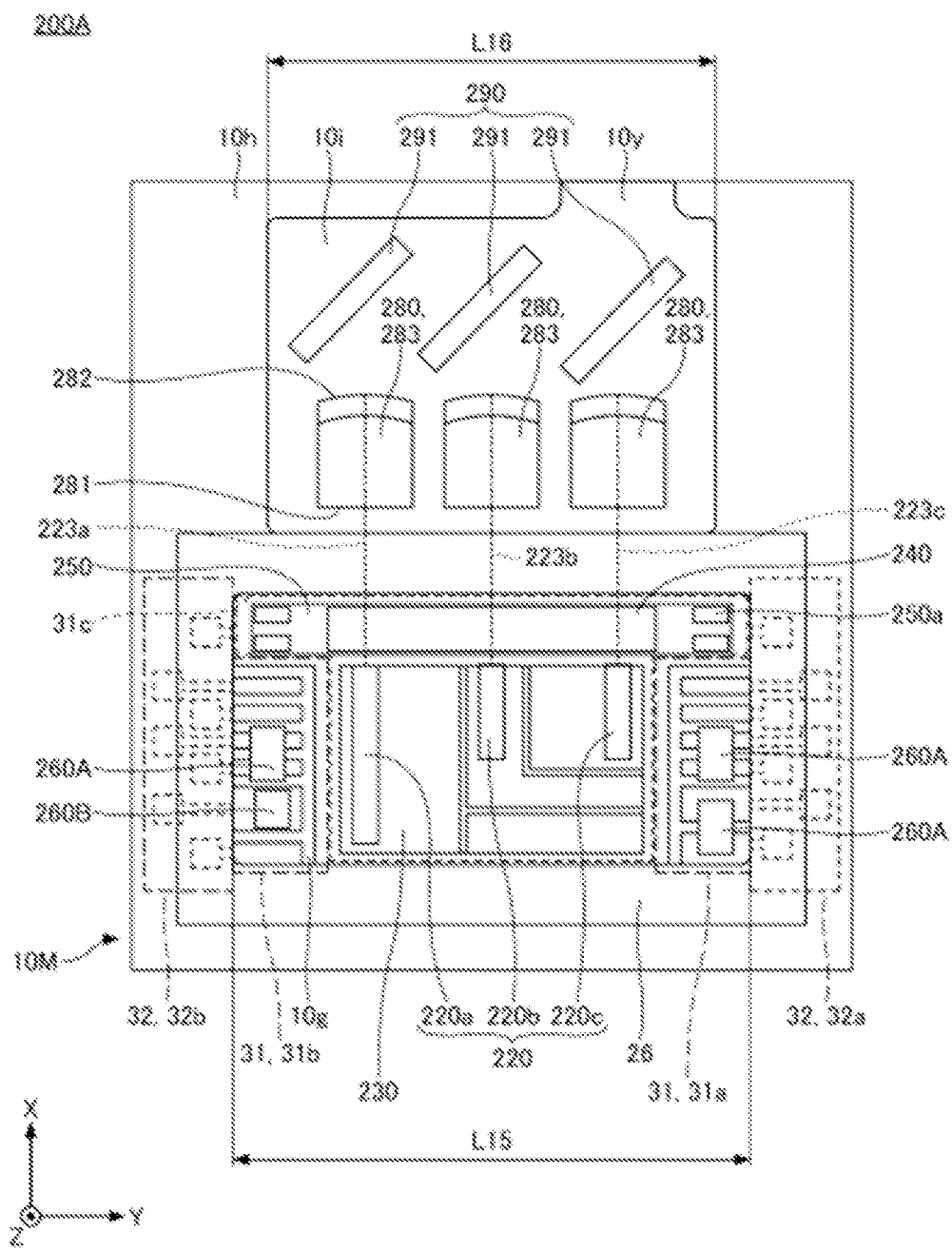
FIG. 13 is a schematic top view of a state in which the first cap, the second cap, and the lid member have been removed from a light-emitting device according to an another example of the second embodiment.

FIG. 13 is a schematic top view of a state in which the first cap 210, the second cap 310, the lid member 320, and the wirings 270 have been removed from the light-emitting device according to the modification of the second embodiment. A light-emitting device 200A according to the modification of the second embodiment includes the wiring board 10M. In the second direction Y, a length L15 of the first mounting surface 10g of the wiring board 10M is greater than a length L16 of the second mounting surface 10i in a top view.

As shown in FIG. 13, the first light-emitting element 220a, the second light-emitting element 220b, and the third light-emitting element 220c are disposed such that the respective emission end surfaces face one lateral surface of the submount 230. In the first direction X, the first light-emitting element 220a, the second light-emitting element 220b, and the third light-emitting element 220c may have different lengths or the same length. In the example shown in the drawing, in the first direction X, the second light-emitting element 220b and the third light-emitting element 220c have the same length, and the length of the first light-emitting element 220a is greater than the lengths of the second light-emitting element 220b and the third light-emitting element 220c.

The first light-emitting element 220a, the second light-emitting element 220b, and the third light-emitting element 220c are disposed apart from one another in the second direction Y in this order in a top view. They are disposed with the longitudinal direction lying along the first direction X. That is, the first light-emitting element 220a, the second light-emitting element 220b, and the third light-emitting element 220c are parallel to one another in a top view. The optical axis 223a of the first light-emitting element 220a, the optical axis 223b of the second light-emitting element 220b, and the optical axis 223c of the third light-emitting element 220c are parallel to one another and are oriented in the first direction X.

The first light-emitting element 220a, the second light-emitting element 220b, and the third light-emitting element 220c are disposed such that the respective emission end surfaces face the same side. In the example shown in the drawings, the emission end surfaces of the first light-emitting element 220a, the second light-emitting element 220b, and the third light-emitting element 220c are all oriented to the first direction X side. The emission end surfaces of the first light-emitting element 220a, the second light-emitting element 220b, and the third light-emitting element 220c can be located on the same straight line parallel to the second direction Y in a top view. The statement "located on the same straight line" as used herein indicates that deviation of ±50 μm in the first direction X is acceptable.

A plurality of lens shapes 283 of the lens member 280 can have the same shape. The lens surfaces 281 of the respective lens shapes 283 can be located on the same straight line parallel to the second direction Y. The statement "located in the same plane" as used herein indicates that deviation of ±50 μm in the first direction X is acceptable. That is, the lens surface 281 of each lens shape 283 can be parallel to the emission end surface of each of the first light-emitting element 220a, the second light-emitting element 220b, and the third light-emitting element 220c.

As described above, in the wiring board 10M used in the light-emitting device 200A, the length L15 of the first mounting surface 10g is greater than the length L16 of the second mounting surface 10i in the second direction Y in a top view. With this structure, the space in which the first light-emitting element 220a, the second light-emitting element 220b, and the third light-emitting element 220c are mounted parallel to one another can be secured. Mounting of the first light-emitting element 220a, the second light-emitting element 220b, and the third light-emitting element 220c is therefore facilitated.

As the wiring board included in the light-emitting device 200 or 200A, a wiring board that does not have part of the features of the wiring boards 10 and 10M in the first embodiment may be used. For example, a wiring board having a first mounting surface, a second mounting surface, and an upper surface at different heights is used for the light-emitting device 200 or 200A, which can miniaturize the light-emitting device 200 or 200A in the third direction Z. In this case, the wiring board may not be limited to the constitution in which the wiring layer includes the first pad portion located in the wiring region and the first pattern portion located in the connecting region.

Even in such a wiring board, the wiring layer can be disposed astride the wiring region 31 and the connecting region 32 by causing the first mounting surface 10g to be located lower than the upper surface 10h. The light-emitting device 200 can be miniaturized in the third direction Z by causing the second mounting surface 10i to be located lower than the first mounting surface 10g and disposing the optical member on the second mounting surface 10i. By causing the second mounting surface 10i to be located lower than the first mounting surface 10g, the heights of the emission points of the light-emitting elements 220 relative to the second mounting surface 10i can be increased compared with the case where the second mounting surface 10i is located higher than the first mounting surface 10g. The light-emitting elements 220 can therefore be disposed such that the main portions of beams emitted from the light-emitting elements 220 pass higher than the upper surface 10h. That is, the main portions of beams emitted from the light-emitting elements 220 are prevented from being applied to the inner lateral surface 10f of the wiring board.

INDUSTRIAL APPLICABILITY

The light-emitting device in the present disclosure can be used for a head-mounted display, a projector, lighting, a display, or the like.

The invention claimed is:
1. A wiring board comprising:
an insulating member having a first upper surface, and a second upper surface located higher than the first upper surface; and
a first wiring layer located on the first upper surface, wherein:
the first upper surface has a wiring region that does not overlap with the second upper surface in a top view, and that is located in an exposed region,
the first wiring layer extends from the wiring region to a connecting region that is connected to the wiring region, that overlaps with the second upper surface in a top view, and that is not exposed,
the first wiring layer comprises a first pad portion located in the wiring region, and a first pattern portion located in the connecting region, and
a length of the first pattern portion is greater than a length of the first pad portion in a first direction perpendicular to a direction in which the first wiring layer extends.

2. The wiring board according to claim 1, comprising:
a through hole extending through the insulating member from below the first pattern portion to the first pattern portion; and
a via wiring connected to the first pattern portion and disposed in the through hole,
wherein the first pattern portion encompasses an outer periphery of the through hole in a top view.

3. The wiring board according to claim 2, wherein:
the length of the first pad portion is shorter than a length of the through hole in the first direction.

4. The wiring board according to claim 1, further comprising:
a second wiring layer extending from the wiring region to the connecting region,
wherein the first wiring layer and the second wiring layer are arranged in a row in the first direction,
wherein the second wiring layer comprises a second pad portion located in the wiring region, and a second pattern portion located in the connecting region, and
wherein a sum of the length of the first pattern portion and a length of the second pattern portion in the first direction is greater than a sum of the length of the first pad portion and a length of the second pad portion in the first direction.

5. The wiring board according to claim 4, wherein:
a distance between a first point of the first pad portion farthest from the second pad portion and a second point of the second pad portion farthest from the first pad portion is shorter than a length determined by adding 20 μm to the sum of the length of the first pattern portion and the length of the second pattern portion in the first direction.

6. The wiring board according to claim 4, wherein:
a distance between a third point of the first pattern portion farthest from the second pattern portion and a fourth point of the second pattern portion farthest from the first pattern portion is shorter than the sum of the length of the first pattern portion and the length of the second pattern portion in the first direction, and
a length from the first pad portion to the first pattern portion is greater than a length from the second pad portion to the second pattern portion in a second direction perpendicular to the first direction.

7. The wiring board according to claim 1, further comprising:
a frame-shaped metal film in a region of the second upper surface surrounding the first upper surface in a top view, wherein:
the first wiring layer overlaps with the metal film in a top view.

8. The wiring board according to claim 1, wherein:
the insulating member further has an inner lateral surface that is connected to the first upper surface at a boundary between the wiring region and the connecting region and intersects with the second upper surface, and
the inner lateral surface is perpendicular to the first upper surface.

9. The wiring board according to claim 1, wherein:
the insulating member further has a third upper surface located lower than the first upper surface,
wherein the second upper surface comprises a region between the first upper surface and the third upper surface in a top view.

10. A light-emitting device comprising:
a wiring board comprising:
an insulating member having a first mounting surface, an upper surface located higher than the first mounting surface, and a second mounting surface, and
a wiring layer located on the first mounting surface;
one or more light-emitting elements disposed on the first mounting surface; and
one or a plurality of optical members disposed on the second mounting surface,
wherein the upper surface comprises a region between the first mounting surface and the second mounting surface in a top view,
wherein the first mounting surface comprises a wiring region,
wherein the wiring layer extends in the wiring region and a connecting region located under the upper surface in a top view,
wherein the wiring layer comprises a first pad portion located in the wiring region and a first pattern portion located in the connecting region, and
wherein a length of the first pattern portion is greater than a length of the first pad portion in a first direction perpendicular to a direction in which the wiring layer extends.

11. The light-emitting device according to claim 10, wherein:
a distance from the first mounting surface to the upper surface is shorter than a distance from the first mounting surface to the second mounting surface in a direction normal to the first mounting surface.

12. The light-emitting device according to claim 10, wherein:
a distance from the first mounting surface to the upper surface is 0.05 mm or more and 1.0 mm or less, and
a distance from the second mounting surface to the upper surface is 0.05 mm or more and 1.05 mm or less in a direction normal to the first mounting surface.

13. The light-emitting device according to claim 10, wherein:
a distance from the first mounting surface to the second mounting surface is 0 mm or more and 1.0 mm or less.

14. The light-emitting device according to claim 10, wherein:
the one or more light-emitting elements comprise a first light-emitting element and a second light-emitting element,
an optical axis of a beam emitted from the first light-emitting element is not parallel to an optical axis of a beam emitted from the second light-emitting element in a top view, and
in a top view, a length of the first mounting surface is shorter than a length of the second mounting surface in a second direction perpendicular to the first direction.

15. The light-emitting device according to claim 10, wherein:
the one or more light-emitting elements comprise a first light-emitting element and a second light-emitting element,
an optical axis of a beam emitted from the first light-emitting element is parallel to an optical axis of a beam emitted from the second light-emitting element in a top view, and
in a top view, a length of the first mounting surface is greater than a length of the second mounting surface in a second direction perpendicular to the first direction.

16. The light-emitting device according to claim 10, wherein:
the one or a plurality of optical members comprise a lens member configured to collimate light emitted from the light-emitting elements,
the lens member has an incident surface facing the light-emitting elements in a traveling direction of the light emitted from the light-emitting elements, and
a main portion of the light emitted from the light-emitting elements comprises light located lower than the upper surface when incident on the incident surface.

17. The light-emitting device according to claim 16, wherein:
the lens member comprises a protrusion,
the second mounting surface has a recess into which the protrusion is inserted, and
a resin bonding the lens member and the wiring board together is disposed in the recess.

18. The light-emitting device according to claim 10, further comprising:
a cap bonded to the wiring board to encapsulate the light-emitting elements, wherein:
the upper surface comprises a surrounding region surrounding the first mounting surface in a top view, and
wherein the cap is bonded to the wiring board with a bonding member disposed in the surrounding region.

* * * * *